United States Patent
Ouchiyama

(10) Patent No.: US 7,489,486 B2
(45) Date of Patent: Feb. 10, 2009

(54) SEMICONDUCTOR DEVICE

(75) Inventor: Masaki Ouchiyama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 411 days.

(21) Appl. No.: 11/425,709

(22) Filed: Jun. 22, 2006

(65) Prior Publication Data
US 2007/0025033 A1 Feb. 1, 2007

(30) Foreign Application Priority Data
Jul. 28, 2005 (JP) ............... 2005-219034

(51) Int. Cl.
*H02H 9/00* (2006.01)
*H02H 1/00* (2006.01)

(52) U.S. Cl. ........................................................ 361/56
(58) Field of Classification Search .................... 361/56
See application file for complete search history.

(56) References Cited

U.S. PATENT DOCUMENTS

| 5,886,558 | A | 3/1999 | Iijima et al. | |
|---|---|---|---|---|
| 6,747,857 | B1 * | 6/2004 | Lee et al. | 361/56 |
| 7,076,757 | B2 * | 7/2006 | Hirata | 716/10 |
| 2005/0180073 | A1 * | 8/2005 | Amer et al. | 361/56 |
| 2007/0097568 | A1 * | 5/2007 | Miske | 361/56 |
| 2008/0175045 | A1 * | 7/2008 | Lin | 365/182 |

* cited by examiner

*Primary Examiner*—Ronald W Leja
(74) *Attorney, Agent, or Firm*—Volentine & Whitt, PLLC

(57) ABSTRACT

A semiconductor device includes at least a plurality of first interface circuits electrically coupled between first and second power supply lines belonging to a first power supply system, one or more first circuits including a first surge current path coupled to the first power supply line and a second surge current path coupled to the second power supply line, a plurality of second interface circuits electrically coupled between third and fourth power supply lines belonging to a second power supply system independent from the first power supply system, and further electrically coupled to a corresponding interface circuit of the plurality of first interface circuits, respectively, and one or more second circuits including a third surge current path coupled to the first circuit and have a first time constant derived by a first resistance coupled to the third surge current path and a first capacitance.

34 Claims, 8 Drawing Sheets

SEMICONDUCTOR DEVICE

BACKGROUND OF THE INVENTION

1. Field of the Invention

The present invention relates to a semiconductor device. In particular, the present invention relates to a semiconductor device that includes a plurality of internal circuits belonging to a plurality of power supply systems that are separated and independent from each other, respectively, and further includes a electrostatic discharge (ESD) protection circuit used to protect interface circuits located between the plurality of internal circuits belonging to the plurality of power supply systems, respectively, from an ESD-originated surge current.

2. Background Information

A semiconductor device has been known which has a plurality of internal circuits belonging to a plurality of power supply systems that are separated and independent from each other, respectively. The plurality of internal circuits are electrically coupled to each other through interface circuits. For example, a signal that is output from an internal circuit belonging to a power supply system is input into another internal circuit belonging to another power supply system through an interface circuit. The interface circuit can be typically comprised of a complementary metal oxide semiconductor (CMOS) inverter circuit.

Each of the internal circuits belonging to each of the power supply systems is comprised of at least a high potential side power supply terminal and at least a low potential side power supply terminal. In other words, each of the plurality of power supply systems that are separated and independent from each other is comprised of at least a high potential side power supply terminal and at least a low potential side power supply terminal. Therefore, a semiconductor device is comprised of at least a high potential side power supply terminal and a low potential side power supply terminal, and the number of terminals which are the same as or greater than the number of the power supply systems. The term "power supply terminal" hereinafter includes not only a high potential side power supply terminal and a low potential side power supply terminal, but a terminal in a path providing power to the circuit.

ESD-originated surge current can be applied to any of the plurality of power supply terminals in the semiconductor device. Therefore, even when surge current is applied to any of the power supply terminals, the ESD protection circuit has to protect each of the interface circuits from surge current.

Japan Patent Application Publication JP-A-09-172146 discloses a semiconductor device in which an ESD protection circuit is provided for an interface circuit located between an analog circuit belonging to a first power supply system and a digital circuit belonging to a second power supply system (especially paragraphs 0010 to 0012, and FIG. 1). The ESD protection circuit is provided for every interface circuit. More specifically, one ESD protection circuit is provided between two CMOS inverter circuits. In general, a semiconductor device has a plurality of interface circuits. Therefore, a semiconductor device has a plurality of ESD protection circuits corresponding to the plurality of interface circuits, respectively.

According to the conventional circuit configuration, ESD protection circuits are required, with the number thereof being the same as the number of the plurality of interface circuits belonging to a power supply system. For example, an interface having logic gate circuits, the number of which is the same as the bit number of a digital signal, can be used for transmitting a digital signal between two internal circuits belonging to power supply systems that are separated and independent from each other, respectively. According to this type of circuit configuration, the increasing number of interface circuits is caused by the increasing bit number of a digital signal, and the increasing number of ESD protection circuits is caused by the increasing number of interface circuits. Furthermore, the area occupied by the plurality of ESD protection circuits will be increased. This makes it difficult to reduce the size of and miniaturize a semiconductor integrated circuit (a semiconductor IC) comprising a semiconductor device.

Therefore, there is a demand for a reduction in the total area occupied by the ESD protection circuit without depending on the bit number of a signal, that is, the number of interface circuits.

In view of the above, it will be apparent to those skilled in the art from this disclosure that there exists a need for an improved semiconductor device. This invention addressed this need in the art as well as other needs, which will become apparent to those skilled in the art from this disclosure.

SUMMARY OF THE INVENTION

In accordance with the present invention, a semiconductor device is provided which comprises at least (i) a plurality of first interface circuits that are electrically coupled between a first power supply line belonging to a first power supply system and a second power supply line belonging to the first power supply system, respectively, (ii) one or more first circuits comprising a first surge current path coupled to the first power supply line and a second surge current path coupled to the second power supply line, the number of first circuits being less than the plurality of first interface circuits, (iii) a plurality of second interface circuits that are electrically coupled between a third power supply line belonging to a second power supply system that is independent from the first power supply system and a fourth power supply line belonging to the second power supply system, respectively, and further electrically coupled to a corresponding interface circuit of the plurality of first interface circuits, respectively, and (iv) one or more second circuits that include a third surge current path coupled to the first circuit and have a first time constant derived by a first resistance coupled to the third surge current path and a first capacitance, the number second circuits being less than the plurality of the second interface circuits.

According to the present invention, the second circuit belonging to the second power supply system is coupled with the first circuit belonging to the first power supply system through the third surge current path. In addition, the second circuit belonging to the second power supply system has a first time constant provided by the first resistance and the first capacitance, both of which are coupled with the third surge current path. Therefore, the first and the second circuits prevent the transistor gate in the interface circuit of the second interface belonging to the second power supply system from being destroyed while breakdown occurs in any of the ESD protection transistors since surge current is applied to them. In addition, first and second circuits must be provided, the number of which being less than a plurality of interface circuits, for the purpose of protecting gates in the plurality of interface circuits. This makes it possible to prevent an increase in the area occupied by a circuit.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Layout of Semiconductor IC to Which Present Invention is Applied

Figure 1:
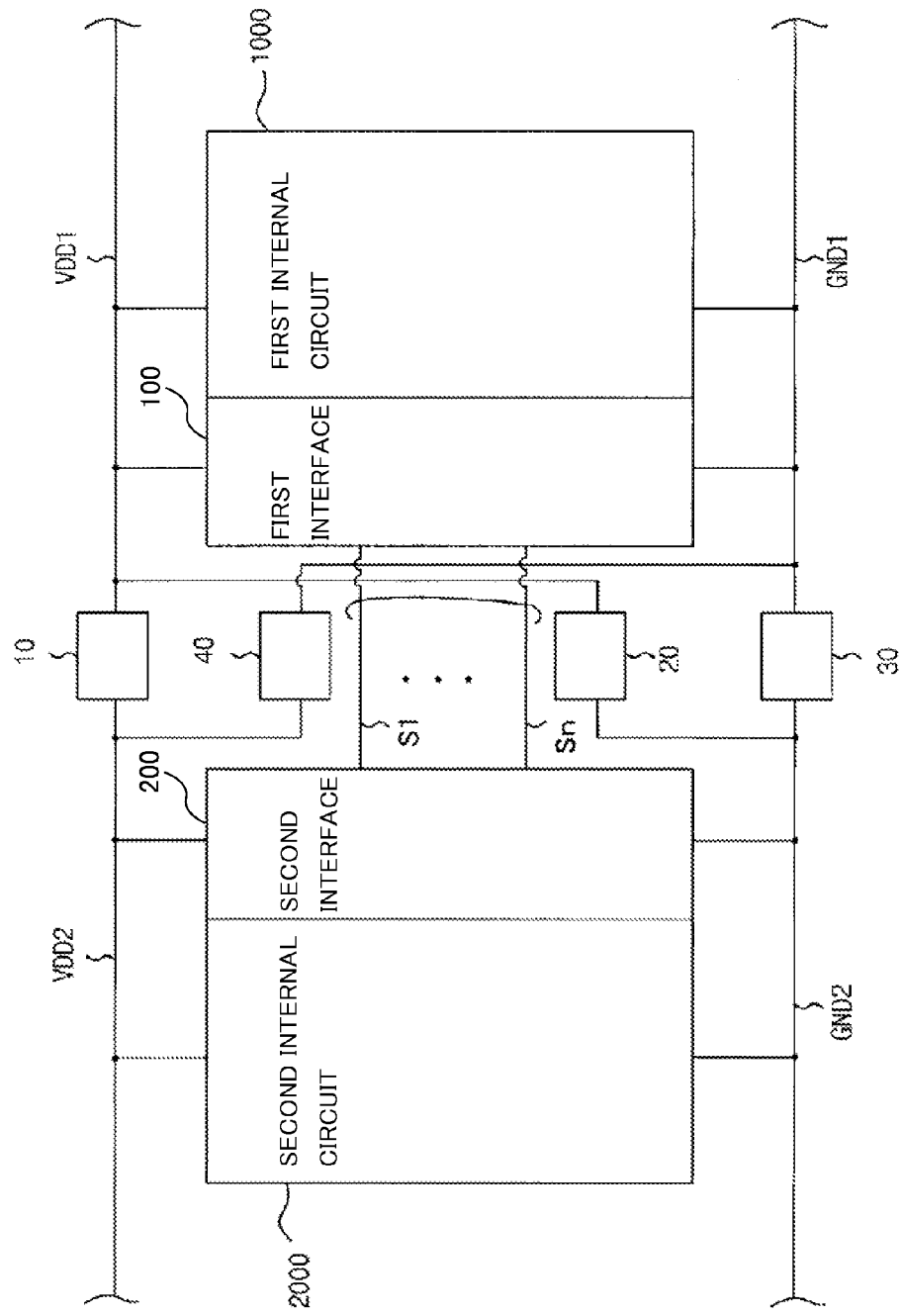
FIG. 1 is a schematic partial plan view showing the layout of a semiconductor IC that can be applied to an ESD protection circuit in accordance with the present invention, and includes two internal circuits and two interfaces, which belong to different power supply systems, respectively.

FIG. 1 is a schematic partial plan view showing the layout of a semiconductor IC that can be applied to an electrostatic discharge (ESD) protection circuit in accordance with the present invention, and includes two internal circuits and two interfaces. Here, the two internal circuits belong to different electric systems, respectively, and the two interfaces belong to different electric systems, respectively.

As shown in FIG. 1, the semiconductor IC to which the present invention is applied is comprised of a first power supply system, and a second power supply system that is separated and independent from the first power supply system. The first power supply system is comprised of a first power supply line VDD1 and a first ground line GND1. The first power supply line VDD1 corresponds to a high potential line belonging to the first power supply system, and the first ground line GND1 corresponds to a low potential line belonging to the first power supply system. The second power supply system is comprised of a second power supply line VDD2 and a second ground line GND2. The second power supply line VDD2 corresponds to a high potential line belonging to the second power supply system, and the second ground line GND2 corresponds to a low potential line belonging to the second power supply system.

The semiconductor IC includes a first internal circuit 1000 and a first interface 100, both of which belong to the first power supply system, and a second internal circuit 2000 and a second interface 200, both of which belong to the second power supply system. The first internal circuit 1000 is coupled between the first power supply line VDD1 and the first ground line GND1. It receives power supplied from the first power supply system and thereby operates. The second internal circuit 2000 is coupled between the second power supply line VDD2 and the second ground line GND2. It receives power supplied from the second power supply system and thereby operates. The first interface 100 is coupled between the first power supply line VDD1 and the first ground line GND1. It receives power supplied from the first power supply system and thereby operates. The second interface 200 is coupled between the second power supply line VDD2 and the second ground line GND2. It receives power supplied from the second power supply system and thereby operates. The first interface 100 is provided in order to be used for the first internal circuit 1000. The second interface 200 is provided in order to be used for the second internal circuit 2000.

Transmission of a signal from/to the first internal circuit 1000 is performed through the first interface 100. Transmission of a signal from/to the second internal circuit 2000 is performed through the second interface 200. When a signal is transmitted from the first internal circuit 1000 to the second internal circuit 2000, a signal is inevitably transmitted from the first interface 100 to the second interface 200. When a signal is transmitted from the second internal circuit 2000 to the first internal circuit 1000, a signal is inevitably transmitted from the second interface 200 to the first interface 100.

Transmission of a signal between the first interface 100 and the second interface 200 is performed through signal lines corresponding to bits, respectively. For example, an n-bit signal is transmitted between the first interface 100 and the second interface 200 using n signal lines S1, S2, S3 ... Sn−2, Sn−1, and Sn. In general, each of the first interface 100 and the second interface 200 has interface logic circuits (i.e., logic gates) corresponding to bits, respectively. For example, an interface used for input and output of an n-bit signal may have n interface logic gates.

When ESD-originated surge current is applied to at least either of the first power supply line VDD1, the first ground line GND1, the second power supply line VDD2, and the second ground line GND2, the interface logic gates included in the first interface 100 and the second interface 200 must be protected from the surge current. Therefore, the first interface 100 and the second interface 200 have a protection circuit, respectively.

The above described semiconductor IC further comprises a first ESD protection element 10 coupled between the first power supply line VDD1 and the second power supply line VDD2. The first ESD protection element 10 allows the surge current applied to the first power supply line VDD1 to be passed through the second power supply line VDD2, and also allows the surge current applied to the second power supply line VDD2 to be passed through the first power supply line VDD1. However, if surge current is not applied to either of the first power supply line VDD1 and the second power supply line VDD2, the first ESD protection element 10 electrically separates the first power supply line VDD1 and the second power supply line VDD2 from each other. The first ESD protection element 10 is comprised of a circuit element having a first breakdown voltage Vb1 that is smaller than surge voltage, and sufficiently larger than the difference between potentials that the first power supply line VDD1 and the second power supply line VDD2 are supposed to have when the semiconductor IC is incorporated in a product and actually operates.

When the semiconductor IC is incorporated in a product and actually acts, the first ESD protection element 10 electrically separates the first power supply line VDD1 and the second power supply line VDD2 from each other. However, when the semiconductor IC has not been incorporated in a product yet, the first power supply line VDD1, the first ground line GND1, the second power supply line VDD2, and the second ground line GND2 are in an electrically floating state. In this floating state, if ESD-originated surge voltage is applied between the first power supply line VDD1 and the second power supply line VDD2, breakdown occurs in the first ESD protection element 10. Thus, a surge current path is assured between the first power supply line VDD1 and the second power supply line VDD2.

The above described semiconductor IC further includes a second ESD protection element 20 coupled between the first power supply line VDD1 and the second ground line GND2. The second ESD protection element 20 allows surge current applied to the first power supply line VDD1 to be passed through the second ground line GND2. In addition, it allows surge current applied to the second ground line GND2 to be passed through the first power supply line VDD1. However, if surge current is not applied to either of the first power supply line VDD1 and the second ground line GND2, the second ESD protection element 20 electrically separates the first power supply line VDD1 and the second ground line GND2 from each other. The second ESD protection element 20 is comprised of a heretofore known circuit element having a second breakdown voltage Vb2 that is smaller than surge voltage and sufficiently larger than the difference between the potentials that the first power supply line VDD1 and the second ground line GND2 are supposed to have when the semiconductor IC is incorporated in a product and actually operates.

When the semiconductor IC is incorporated in a product and actually operates, the second ESD protection element 20 electrically separates the first power supply line VDD1 and the second ground line GND2 from each other. However, when the semiconductor IC has not been incorporated in a product yet, the first power supply line VDD1, the first ground line GND1, the second power supply line VDD2, and the second ground line GND2 are in an electrically floating state. In this floating state, if ESD originated surge voltage is applied between the first power supply line VDD1 and the second ground line GND2, breakdown occurs in the second ESD protection element 20. Thus, a surge current path is assured between the first power supply line VDD1 and the second ground line GND2. The above described semiconductor IC further includes a third ESD protection element 30 coupled between the first ground line GND1 and the second ground line GND2. The third ESD protection element 30 allows surge current applied to the first ground line GND1 to be passed through the second ground line GND2, and also allows surge current applied to the second ground line GND2 to be passed through the first ground line GND1. However, surge current is not applied to either of the first ground line GND1 and the second ground line GND2, and the third ESD protection element 30 electrically separates the first ground line GND1 and the second ground line GND2 from each other. The third ESD protection element 30 is comprised of a circuit element having a third breakdown voltage Vb3 that is smaller than surge voltage, and sufficiently larger than the difference between potentials that the first ground line GND1 and the second ground line GND2 are supposed to have when the semiconductor IC is incorporated in a product and actually operates.

When the semiconductor IC is incorporated in a product and actually operates, the third ESD protection element 30 electrically separates the first ground line GND1 and the second ground line GND2 from each other. However, when the semiconductor IC has not been incorporated in a product yet, the first power supply line VDD1, the first ground line GND1, the second power supply line VDD2, and the second ground line GND2 are in an electrically floating state. In this floating state, if ESD-originated surge voltage is applied between the first ground line GND1 and the second ground line GND2, breakdown occurs in the third ESD protection element 30. Thus, a surge current path is assured between the first ground line GND1 and the second ground line GND2.

The above described semiconductor IC further comprises a fourth ESD protection element 40 coupled between the second power supply line VDD2 and the first ground line GND1. The fourth ESD protection element 40 allows surge current applied to the second power supply line VDD2 to be passed through the first ground line GND1, and also allows surge current applied to the first ground line GND1 to be passed through the second power supply line VDD2. However, if surge current is not applied to either of the second power supply line VDD2 and the first ground line GND1, the fourth ESD protection element 40 electrically separates the second power supply line VDD2 and the first ground line GND1 from each other. The fourth ESD protection element 40 is comprised of a circuit element having a fourth breakdown voltage Vb4 that is smaller than surge voltage, and sufficiently larger than the difference between potentials that the second power supply line VDD2 and the first ground line GND1 are supposed to have when the semiconductor IC is incorporated in a product and actually operates.

When the semiconductor IC is incorporated in a product and actually operates, the fourth ESD protection element 40 electrically separates the second power supply line VDD2 and the first ground line GND1 from each other. However, when the semiconductor IC has not been incorporated in a product yet, the first power supply line VDD1, the first ground line GND1, the second power supply line VDD2, and the second ground line GND2 are in an electrically floating state. In this floating state, if ESD-originated surge voltage is applied between the second power supply line VDD2 and the first ground line GND1, breakdown occurs in the fourth ESD protection element 40. Thus, a surge current path is assured between the second power supply line VDD2 and the first ground line GND1. The above described transmission of a signal between the first interface 100 and the second interface 200 is performed through a plurality of signal lines corresponding to bits of the signal, respectively. For example, an n-bit signal can be transmitted through n signal lines S1 . . . Sn which are arranged between the first interface 100 and the second interface 200.

As described above, the first interface 100 and the second interface 200, respectively, can be comprised of a plurality of logic circuits. The plurality of logic circuits correspond to bits of a signal, respectively. Therefore, the plurality of logic circuits must be protected from surge current. Because of this, a heretofore known circuit configuration has an ESD protection circuit with respect to every plurality of logic circuits comprising an interface belonging to a power supply system. For example, an interface having logic gate circuits, the number of which is the same as the bit number of a digital signal, can be used for transmitting the digital signal between two internal circuits belonging to mutually independent power supply systems. According to this circuit configuration, when the bit number of a digital signal is increased, the number of the interface logic circuits will be increased. In addition, when the number of the interface logic circuits is increased, the number of the ESD protection circuits will be increased. Thus, the total area occupied by the plurality of the ESD protection circuits will be increased. This makes it difficult to reduce the size of and miniaturize the semiconductor IC comprising the semiconductor device.

Figure 2:
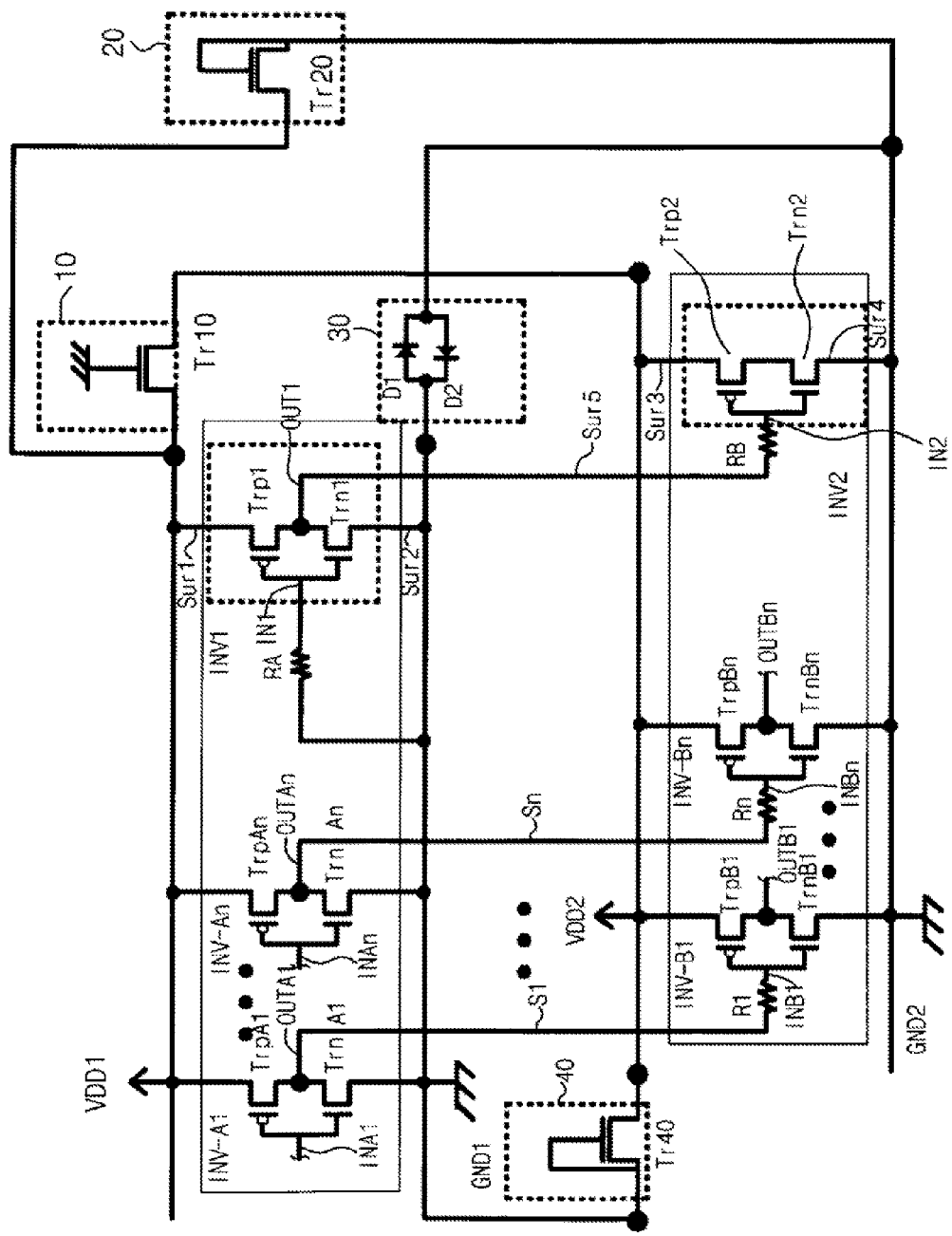
FIG. 2 is an equivalent circuit schematic of an ESD protection circuit included in an interface in accordance with a first embodiment of the present invention.

However, according to the present invention, the ESD protection circuit has a circuit configuration that makes it possible to reduce the total area occupied by the ESD protection circuit without depending on the bit number of a signal, that is, the number of the interface logic circuits. This will be hereinafter explained in detail. Circuit configuration of ESD protection circuit included in interface FIG. 2 is an equivalent circuit schematic of an ESD protection circuit included in an interface in accordance with a first embodiment of the present invention. The ESD protection circuit has a circuit configuration that makes it possible to minimize the total area occupied by the ESD protection circuit without depending on the bit number of a signal, that is, the number of interface logic circuits. A specific circuit configuration will be hereinafter described on the assumption that an n-bit digital signal is transmitted from the first interface 100 to the second interface 200.

The first interface 100 belonging to the above described first power supply system is coupled between the first power supply line VDD1 corresponding to a high potential line belonging to the first power supply system, and the first ground line GND1 corresponding to a low potential line belonging to the first power supply system. The second interface 200 belonging to the above described second power supply system is coupled between the second power supply line VDD2 corresponding to a high potential line belonging to the second power supply system and the second ground line GND2 corresponding to a low potential line belonging to the second power supply system.

The above described first interface 100 includes first to n-th interface logic circuits INV-A1 . . . INV-An and a first protection logic circuit INV1. The first protection logic circuit INV1 is a circuit to protect the first to n-th interface logic circuits INV-A1 . . . INV-An from surge current. In addition, it is not involved in signal processing. In other words, a signal will not be input into and output from the first protection logic circuit INV1. Therefore, the first protection logic circuit INV1 can be considered as a dummy logic gate. Each of the first to n-th interface logic circuits INV-A1 . . . INV-An is electrically coupled between the first power supply line VDD1 corresponding to a high potential line belonging to the first power supply system, and the first ground line GND1 corresponding to a low potential line belonging to the first power supply system. The first protection logic circuit INV1 is electrically coupled between the first power supply line VDD1 corresponding to a high potential line belonging to the first power supply system, and the first ground line GND1 corresponding to a low potential line belonging to the first power supply system. The first to n-th interface logic circuits INV-A1 . . . INV-An have inputs INA1 . . . INAn, respectively. The inputs INA1 . . . INAn are coupled to the above described first internal circuit 1000 shown in FIG. 1. The first to n-th interface logic circuits INV-A1 . . . INV-An have outputs OUTA1 . . . OUTAn, respectively. The outputs OUTA1 . . . OUTAn are coupled to the signal lines S1 . . . Sn, respectively. The first to n-th interface logic circuits INV-A1 . . . INV-An can be comprised of a heretofore known logic gate such as a CMOS inverter.

The first interface logic circuit INV-A1 is comprised of a PMOS transistor TrpA1 and an NMOS transistor TrpA1. A gate of the PMOS transistor TrpA1 and a gate of the NMOS transistor TrpA1 are coupled to the input INA1. The input INA1 is coupled to the first internal circuit 1000 and receives the first bit input of a signal transmitted from the first internal circuit 1000. A drain of the PMOS transistor TrpA1 and the drain of the NMOS transistor TrA are coupled to the output OUTA1. The output OUTA1 is coupled to the signal line S1. A source of the PMOS transistor TrpA1 coupled to the first power supply line VDD1, and a source of the NMOS transistor TrnA1 is coupled to the first ground line GND1.

The n-th interface logic circuit INV-An is comprised of a PMOS transistor TrpAn and an NMOS transistor TrnAn. A gate of the PMOS transistor TrpAn and a gate of the NMOS transistor TrnAn are coupled to an input INAn. The input INAn is coupled to the first internal circuit 1000 and receives the n-th bit input of a signal transmitted from the first internal circuit 1000. A drain of the PMOS transistor TrpAn and a drain of the NMOS transistor TrnAn are coupled to the output OUTAn. The output OUTAn is coupled to a signal line Sn. A source of the PMOS transistor TrpAn is coupled to the first power supply line VDD1. A source of the NMOS transistor TrnAn is coupled to the first ground line GND1.

The above described first protection logic circuit INV1 has a first surge current path Sur1. The first surge current path Sur1 is coupled to the first power supply line VDD1. The first protection logic circuit INV1 has a second surge current path Sur2. The second surge current path Sur2 is coupled to the first ground line GND1. As described above, the first protection logic circuit INV1 is a circuit used to protect the first to n-th interface logic circuits INV-A1 . . . INV-An from surge current and it is not involved in signal processing. In other words, a signal is not input into and output from the first protection logic circuit INV1. Therefore, the first protection logic circuit INV1 has an input INV1, but the input IN1 is coupled to the first ground line GND1 and any signal is input in the input INV1. Here, the input IN1 has a resistance RA. The first protection logic circuit INV1 has an output OUT1. The output OUT1 is coupled to the fifth surge current path Sur5. The first protection logic circuit INV1 can be comprised of a heretofore known logic gate such as a CMOS inverter. The first protection logic circuit INV1 is comprised of a PMOS transistor Trp1 and an NMOS transistor Trn1. A gate of the PMOS transistor Trp1 and a gate of the NMOS transistor Trn1 are coupled to the input IN1. The input IN1 is coupled to the first ground line GND1. A drain of the PMOS transistor Trp1 and a drain of the NMOS transistor Trn1 are coupled to the output OUT1. The output OUT1 is coupled to the fifth surge current path Sur5. A source of the PMOS transistor Trp1 is coupled to the first power supply line VDD1 through the first surge current path Sur1. A source of the NMOS transistor Trn1 is coupled to the first ground line GND1 through the second surge current path Sur2. The above described second interface 200 has a first to n-th interface logic circuits INV-B1 . . . INV-Bn and a second protection logic circuit INV2. The second protection logic circuit INV2 is a circuit used to protect the first to n-th interface logic circuits INV-B1 . . . INV-Bn from surge current, and it is not involved in signal processing. In other words, a signal is not input into and output from the second protection logic circuit INV2. Therefore, the second protection logic circuit INV2 can be considered as a dummy logic gate. Each of the first to n-th interface logic circuits INV-B1 . . . INV-Bn is electrically coupled between the second power supply line VDD2 corresponding to a high potential line belonging to the second power supply system, and the second ground line GND2 corresponding to a low potential line belonging to the second power supply system. The second protection logic circuit INV2 is electrically coupled between the second power supply line VDD2 corresponding to a high potential line belonging to the second power supply system, and the second ground line GND2 corresponding to a low potential line belonging to the second power supply system.

The first to n-th interface logic circuits INV-B1 . . . INV-Bn have inputs INB1 . . . INBn, respectively. The inputs INB1 . . . INBn are coupled to the above described signal lines S1 . . . Sn, respectively. The inputs INB1 . . . INBn of the first to n-th interface logic circuits INV-B1 . . . INV-Bn are coupled to the outputs OUTA1 . . . OUTAn of the above described first to n-th interface logic circuits INV-A1 . . . INV-An through the signal lines S1 . . . Sn, respectively. The first to n-th interface logic circuits INV-B1 . . . INV-Bn receive a signal transmitted from the first to n-th interface logic circuits INV-A1 . . . INV-An through the signal lines S1 . . . Sn. The first to n-th interface logic circuits INV-B1 . . . INV-Bn have outputs OUTB1 . . . OUTBn, respectively. The outputs OUTB1 . . . OUTBn are coupled to the above described second internal circuit 2000 shown in FIG. 1. The first to n-th interface logic circuits INV-B1 . . . INV-Bn can be comprised of a heretofore known logic gate such as a CMOS inverter.

The first interface logic circuit INV-B1 is comprised of a PMOS transistor TrpB1 and an NMOS transistor TrnB1. A gate of the PMOS transistor TrpB1 and a gate of the NMOS transistor TrnB1 are coupled to an input INB1. The input INB1 is coupled to the output OUTA1 of the first interface logic circuit INV-A1 through the signal line S1, and receives a first bit input of a signal. A drain of the PMOS transistor TrpB1 and a drain of the NMOS transistor TrnB1 are coupled to the output OUTB1. The output OUTB1 is coupled to the second internal circuit 2000 shown in FIG. 1. A source of the PMOS transistor TrpB1 is coupled to the second power supply line VDD2, and the source of the NMOS transistor TrnB1 is coupled to the second ground line GND2.

The n-th interface logic circuit INV-Bn is comprised of a PMOS transistor TrpBn and an NMOS transistor TrnBn. A gate of the PMOS transistor TrpBn and a gate of the NMOS transistor TrnBn are connected to an input INBn. The input INBn is coupled to the output OUTAn of the n-th interface logic circuit INV-An through the signal line Sn, and receives the n-th bit input of a signal. A drain of the PMOS transistor TrpBn and a drain of the NMOS transistor TrnBn are coupled to the output OUTBn. The OUTBn is coupled to the second internal circuit 2000 shown in FIG. 1. A source of the PMOS transistor TrpBn is coupled to the second power supply line VDD2, and a source of the NMOS transistor TrnBn is coupled to the second ground line GND2.

The above described second protection logic circuit INV2 has a third surge current path Sur3. The third surge current path Sur3 is coupled to the second power supply line VDD2. The second protection logic circuit INV2 has a fourth surge current path Sur4. The fourth surge current path Sur4 is coupled to the second ground line GND2. As described above, the second protection logic circuit INV2 is a circuit to protect the first to n-th interface logic circuits INV-B1 . . . INV-Bn from surge current, and not involved in signal processing. In other words, a signal is not input into and output from the second protection logic circuit INV2. Therefore, the second protection logic circuit INV2 has an input IN2, but the input IN2 is coupled to the above described fifth surge current path Sur5. In other words, the input IN2 of the second protection logic circuit INV2 is coupled to the output OUT1 of the above described first protection logic circuit INV1 through the fifth surge current path Sur5. Therefore, a signal is not input into the input IN2. Here, the input IN2 has a resistance RB. The second protection logic circuit INV2 is not involved in any signal processing. Therefore, it is not required to include an output. The second protection logic circuit INV2 can be comprised of a logic gate that is created by changing a heretofore known logic gate and does not have an output, such as a CMOS inverter without an output. The second protection logic circuit INV2 is comprised of a PMOS transistor Trp2 and an NMOS transistor Trn2. A gate of the PMOS transistor Trp2 and a gate of the NMOS transistor Trn2 are coupled to an input IN2. The input IN2 is coupled to the output OUT1 of the above described first protection logic circuit INV1 through the fifth surge current path Sur5. A drain of the PMOS transistor Trp2 and a drain of the NMOS transistor Trn2 are coupled to each other. A source of the PMOS transistor Trp2 is coupled to the second power supply line VDD2 through the third surge current path Sur3. A source of the NMOS transistor Trn2 is coupled to the second ground line GND2 through a fourth surge current path Sur4.

As described above, the first ESD protection element 10 is coupled between the first power supply line VDD1 and the second power supply line VDD2. The first ESD protection element 10 can be comprised of a heretofore known element. The first ESD protection element 10 can be comprised of a first ESD protection transistor Tr10. Specifically, the first ESD transistor Tr10 can be comprised of an NMOS transistor. Either of the source and drain of the NMOS transistor is coupled to the first power supply line VDD1, and the other of them is coupled to the second power supply line VDD2. A gate of the NMOS transistor gate is held at a ground potential and the NMOS transistor is maintained in an off-state. The first ESD protection transistor Tr10 can be comprised of a PMOS transistor. In this case, a gate of the PMOS transistor is held at a high potential and the PMOS transistor is maintained in an off-state. The first ESD protection transistor Tr10 allows surge current applied to the first power supply line VDD1 to be passed through the second power supply line VDD2, and also allows surge current applied to the second power supply line VDD2 to be passed through the first power supply line VDD1. However, surge current is not applied to either of the first power supply line VDD1 and the second power supply line VDD2, and the first ESD protection transistor Tr10 electrically separates the first power supply line VDD1 and the second power supply line VDD2. The first ESD protection transistor Tr10 has the first breakdown voltage Vb1 that is smaller than surge voltage and sufficiently larger than the difference between potentials that the first power supply line VDD1 and the second power supply line VDD2 are supposed to have when the semiconductor IC is incorporated in a product and actually operates. Note that experience will indicate the surge voltage level.

When the semiconductor IC is incorporated in a product and actually operates, the first ESD protection transistor Tr10 electrically separates the first power supply line VDD1 and the second power supply line VDD2 from each other. However, when the semiconductor IC has not been incorporated in a product yet, the first power supply line VDD1, the first ground line GND1, the second power supply line VDD2, and the second ground line GND2 are in an electrically floating state. In this floating state, if ESD-originated surge voltage is applied between the first power supply line VDD1 and the second power supply line VDD2, breakdown occurs in the first ESD protection transistor Tr10. Thus, a surge current path is assured between the first power supply line VDD1 and the second power supply line VDD2.

As described above, the second ESD protection element 20 is coupled between the first power supply line VDD1 and the second ground line GND2. The second ESD protection element 20 can be comprised of a heretofore known element. The second ESD protection element 20 can be comprised of a second ESD protection transistor Tr20. Specifically, the second ESD protection transistor Tr20 can be comprised of an NMOS transistor. Either of a source and a drain of the NMOS transistor is coupled to the first power supply line VDD1, and the other of them is coupled to the second power supply line VDD2. A gate of the NMOS transistor is coupled to the second ground line GND2, and the NMOS transistor is maintained in an off-state. The second ESD protection transistor Tr20 allows surge current applied to the first power supply line VDD1 to be passed through the second ground line GND2, and also allows surge current applied to the second ground line GND2 to be passed through the first power supply line VDD1. However, if surge current is not applied to either of the first power supply line VDD1 and the second ground line GND2, the second ESD protection transistor Tr20 electrically separates the first power supply line VDD1 and the second ground line GND2 from each other. The second ESD protection transistor Tr20 has a second breakdown voltage Vb2 that is smaller than surge voltage, and sufficiently larger than the difference between potentials that the first power VDD1 and the second ground line GND2 are supposed to have when the semiconductor IC is incorporated in a product and actually operates.

When the semiconductor IC is incorporated in a product and actually operates, the second ESD protection transistor Tr20 electrically separates the first power supply line VDD1 and the second ground line GND2 from each other. However, if the semiconductor IC has not been incorporated in a product yet, the first power supply line VDD1, the first ground line GND1, the second power supply line VDD2, and the second ground line GND2 are in an electrically floating state. In this floating state, if ESD-originated surge voltage is applied between the first power supply line VDD1 and the second ground line GND2, breakdown occurs in the second ESD protection transistor Tr20. Thus, a surge current path is assured between the first power supply line VDD1 and the second ground line GND2.

As described above, the third ESD protection element 30 is coupled between the first ground line GND1 and the second ground line GND2. The third ESD protection element 30 can be comprised of a heretofore known element. The third ESD protection element 30 can be comprised of an anti-parallel coupling of two diodes D1 and D2, which are arranged between the first ground line GND1 and the second ground line GND2. In other words, the third ESD protection element 30 is comprised of a diode D1 that is coupled between the first ground line GND1 and the second ground line GND2, and a diode D2 that is coupled between the first ground line GND1 and the second ground line GND2 in parallel to and in an inverse direction from the diode D1. Two anti-parallel coupled diodes D1 and D2 allow surge current applied to the first ground line GND1 to be passed through the second ground line GND2, and also allow surge current applied to the second ground line GND2 to be passed through the first ground line GND1. However, if surge current is not applied to either of the first ground line GND1 and the second ground line GND2, the two anti-parallel coupled diodes D1 and D2 electrically separate the first ground line GND1 and the second ground line GND2 from each other. The two anti-parallel coupled diodes D1 and D2 have a third breakdown voltage Vb3 that is smaller than surge voltage.

When the semiconductor IC is incorporated in a product and actually operates, the two anti-parallel coupled diodes D1 and D2 electrically separate the first ground line GND1 and the second ground line GND2 from each other. However, if the semiconductor IC has not been incorporated in a product yet, the first power supply line VDD1, the first ground line GND1, the second power supply line VDD2, and the second ground line GND2 are in an electrically floating state. In this floating state, if ESD-originated surge voltage is applied between the first ground line GND1 and the second ground line GND2, breakdown occurs in the third ESD protection element 30. Thus, a surge current path is assured between the first ground line GND1 and the second ground line GND2.

As described above, the fourth ESD protection element 40 is coupled between the second power supply line VDD2 and the first ground line GND1. The fourth ESD protection element 40 can be comprised of a heretofore known element. The fourth ESD protection element 40 can be comprised of a fourth ESD protection transistor Tr40. Specifically, the fourth ESD protection transistor Tr40 can be comprised of an NMOS transistor. Either of a source and drain of the NMOS transistor is coupled to the first power supply line VDD1, and the other of them is coupled to the second power supply line VDD2. A gate of the NMOS transistor is coupled to the first ground line GND1, and the NMOS transistor is maintained in an off-state. The fourth ESD protection transistor Tr40 allows surge current applied to the second power supply line VDD2 to be passed through the first ground line GND1, and also allows surge current applied to the first ground line GND1 to be passed through the second power supply line VDD2. However, if surge current is not applied to either of the second power supply line VDD2 and the first ground line GND1, the fourth ESD protection transistor Tr40 electrically separates the second power supply line VDD2 and the first ground line GND1 from each other. The fourth ESD protection transistor Tr40 has a fourth breakdown voltage Vb4 that is smaller than surge voltage, and sufficiently larger than the difference between potentials that the second power supply line VDD2 and the first ground line GND1 are supposed to have when the semiconductor IC is incorporated in a product and actually operates.

When the semiconductor IC is incorporated in a product and actually operates, the fourth ESD protection transistor Tr40 electrically separates the second power supply line VDD2 and the first ground line GND1 from each other. However, when the semiconductor IC has not been incorporated yet, the first power supply line VDD1, the first ground line GND1, the second power supply line VDD2, and the second ground line GND2 are in an electrically floating state. In this floating state, if ESD-originated surge voltage is applied between the second power supply line VDD2 and the first ground line GND1, breakdown occurs in the fourth ESD protection transistor Tr40. Thus, a surge current path is assured between the second power supply line VDD2 and the first ground line GND1.

As described above, a single first protection logic circuit INV1 is provided for the first interface 100 belonging to the first power supply system. In addition, a single second protection logic circuit INV2 is provided in order to be used for the second interface 200 belonging to the second power supply system. The first protection logic circuit INV1 and the second protection logic circuit INV2 provide a surge current path that is assured when surge current is applied to either of the first power supply line VDD1 corresponding to a high potential line belonging to the first power supply system, the first ground line GND1 corresponding to a low potential line belonging to the first power supply system, the second power supply line VDD2 corresponding to a high potential line belonging to the second power supply system, and the second ground line GND2 corresponding to a low potential line belonging to the second power supply system, more specifically, either of the above described first to fifth surge current paths Sur1 to Sur5. In other words, the first protection logic circuit INV1 provides the first surge current path Sur1 that is coupled to the first power supply line VDD1 and the second surge current path Sur2 that is coupled to the first ground line GND1. The second protection logic circuit INV2 provides the third surge current path Sur3 that is coupled to the second power supply line VDD2 and the fourth surge current path Sur4 that is coupled to the second ground line GND2. Furthermore, the fifth surge current path Sur5 is provided which couples the output OUT1 of the first protection logic circuit INV1 and the input IN2 of the second protection logic circuit INV2.

If surge current is applied to either of the first power supply line VDD1, the first ground line GND1, the second power supply line VDD2, and the second ground line GND2, breakdown occurs in either of the above described first to fourth ESD protection transistors Tr10 to Tr40 and a surge current path will be formed. The above described first protection logic circuit INV1 and the second protection logic circuit INV2 protect the PMOS transistors TrpB1 .... TrpBn of the interface logic circuits INV-B1 ... INV-Bn and the PMOS transistor Trp1 of the second protection logic circuit INV2, both of which are included in the second interface 200 belonging to the second power supply system, from being destroyed until breakdown occurs in either of the above described first to fourth ESD protection transistors Tr10 to Tr40 since surge current has been applied. Because of this, the input IN2 of the second protection logic circuit INV2 has capacitance that is charged with surge current until breakdown occurs in the above described first to fourth ESD protection transistors Tr10 to Tr40 since surge current has been applied to either of the first power supply line VDD1, the first ground line GND1, the second power supply line VDD2, and the second ground line GND2. Note that the time that the breakdown that occurs in the first to fourth ESD protective transistors Tr10 to Tr40 is hereinafter called breakdown time. That is to say, the input IN2 of the second protection logic circuit INV2 has a time constant RC that is larger than any of the breakdown times of the above described first to fourth ESD protection transistors Tr10 to Tr40, respectively.

As described above, the second protection logic circuit INV2 is comprised of the PMOS transistor Trp2 and the NMOS transistor Trn2. The input N2 of the second protection logic circuit INV2 has a time constant RC that is larger than any of the breakdown times of the above described first to fourth ESD protection transistors Tr10 to Tr40, respectively. The time constant RC is derived by product of the resistance value R of the resistance RB and the sum of the gate capacitance of the PMOS transistor Trp2 and the gate capacitance of the NMOS transistor Trn2 (i.e., R times C). Capacitance C of the input IN2 of the second protection logic circuit INV2 is derived by the product of the gate width W and the gate length L (i.e., W times L).

As described above, the first protection logic circuit INV1 belonging to the first power supply system and the second protection logic circuit INV2 belonging to the second power supply system are installed in order to provide a surge current path. In addition, the second protection logic circuit INV2 is formed to provide a capacitance that is charged with surge current until breakdown occurs in the first to fourth ESD protection elements 10, 20, 30, and 40. This will be hereinafter explained in detail. Inputs of the first to n-th interface logic circuits INV-A1 ... INV-An belonging to the first power supply system is designed to be coupled to the first internal circuit 1000 belonging to the first power supply system and receive a signal. On the other hand, inputs of the interface logic circuits INV-B1 ... INV-Bn belonging to the second power supply system is also designed to receive outputs submitted from the first to n-th interface logic circuits INV-A1 ... INV-An.

If surge current is applied to either of the first power supply line VDD1, the first ground line GND1, the second power supply line VDD2, and the second ground line GND2, breakdown occurs in either of the first ESD protection element 10, the second ESD protection element 20, the third ESD protection element 30, and the fourth ESD protection element 40 and a surge current path is provided. However, the first ESD protection element 10, the second ESD protection element 20, the third ESD protection element 30, and the fourth ESD protection element 40 have a breakdown time, respectively. In other words, no surge current path is formed among the first power supply line VDD1, the first ground line GND1, the second power supply line VDD2, and the second ground line GND2 until breakdown occurs in either of the first ESD protection element 10, the second ESD protection element 20, the third ESD protection element 30, and the fourth ESD protection element 40, since surge current has been applied to either of the first power supply line VDD1, the first ground line GND1, the second power supply line VDD2, and the second ground line GND2. Because of this, surge current is passed through the gates of the transistors of the interface logic circuits INV-B1 ... INV-Bn and the second protection logic circuit INV2, both of which belong to the second power supply system, until breakdown occurs in either of the first ESD protection element 10, the second ESD protection element 20, the third ESD protection element 30, and the fourth ESD protection element 40 since surge current has been applied to either of the first power supply line VDD1 and the first ground line GND1.

The interface logic circuits INV-B1 ... INV-Bn and the second protection logic circuit INV2 are coupled to the first to n-th interface logic circuits INV-A1 ... INV-An and the first protection logic circuit INV1 through the signal lines S1 ... Sn and the fifth surge current path Sur5, respectively. Here, the signal lines S1 ... Sn and the fifth surge current path Sur5 have the resistances R1 ... Rn and the resistance RB, respectively. Therefore, surge current in response to the resistance divider ratio is passed through inputs of the interface logic circuits INV-B1 ... INV-Bn and the second protection logic circuit INV2, respectively.

Therefore, it is effective to define the resistance divider ratio so that most of the surge current is passed through the gates of the PMOS transistor Trp2 and the NMOS transistor Trn2 of the second protection logic circuit INV2 belonging to the second power supply system for the purpose of avoiding the destruction of the gates of the transistors of the interface logic circuits INV-B1 ... INV-Bn belonging to the second power supply system. Specifically, it is preferable that the resistance RB of the fifth surge current path Sur5 coupling the output of the first protection logic circuit INV1 and the input of the second protection logic circuit INV2 is sufficiently smaller than any of the resistances R1 ... Rn of the signal lines S1 ... Sn, which couple the outputs of the first to n-th interface logic circuits INV-A1 ... INV-An and inputs of the interface logic circuits INV-B1 ... INV-Bn, respectively.

If the resistance RB of the fifth surge current path Sur5 coupling the output of the first protection logic circuit INV1 and the input of the second protection logic circuit INV2 is sufficiently smaller than any of the resistances R1 . . . Rn of the signal lines S1 . . . Sn, respectively, which couple the outputs of the first to n-th interface logic circuits INV-A1 . . . INV-An and the inputs of the interface logic circuits INV-B1 . . . INV-Bn, respectively, most of the surge current is received by the input of the second protection logic circuit INV2.

In addition, the input of the second protection logic circuit INV2 has a capacitance approximately corresponding to the sum of the gate capacitance of the PMOS transistor Trp2 and the gate capacitance of the NMOS transistor Trn2. Most of the above described surge current is passed through the gates of the PMOS transistor Trp2 and the NMOS transistor Trn2, and thus the gate capacitance is charged. No gates of the transistors of the interface logic circuits INV-B1 . . . INV-Bn are destroyed while the gate capacitance of the input of the second protection logic circuit INV2 is charged with surge current. Also, no gates of the transistors of the interface logic circuits INV-B1 . . . INV-Bn are destroyed after breakdown occurs in either of the first ESD protection element 10, the second ESD protection element 20, the third ESD protection element 30, and the fourth ESD protection element 40, and then surge current paths are formed among the first power supply line VDD1, the first ground line GND1, the second power supply line VDD2, and the second ground line GND2. Therefore, no gates of the transistors of the interface logic circuits INV-B1 . . . INV-Bn are destroyed if breakdown occurs in either of the first ESD protection element 10, the second ESD protection element 20, the third ESD protection element 30, and the fourth ESD protection element 40 while surge current is applied to either of the first power supply line VDD1, the first ground line GND1, the second power supply line VDD2, and the second ground line GND2 and then the gate capacitance of the input of the second protection logic circuit INV2 is charged with surge current. Therefore, destruction of the gates of the transistors in the interface logic circuits INV-B1 . . . INV-Bn can be avoided by the input of the second protection logic circuit INV2, which has a time constant longer than the time until breakdown occurs in either of the first ESD protection element 10, the second ESD protection element 20, the third ESD protection element 30, and the fourth ESD protection element 40 after surge current is applied to either of the first power supply line VDD1, the first ground line GND1, the second power supply line VDD2, and the second ground line GND2.

A time constant of the input of the second protection logic circuit INV2 is derived by the product of the sum of the gate capacitance Cp of the PMOS transistor Trp2 and the gate capacitance Cn of the NMOS transistor Trn2 (i.e., C=Cp+Cn) and the resistance RB of the fifth surge current path Sur5 that couples the output of the first protection logic circuit INV1 and the input of the second protection logic circuit INV2. In short, the time constant of the input of the second protection logic circuit INV2 is derived by the product of C and RB. The gate of the PMOS transistor Trp2 and the gate of the NMOS transistor Trn2 are designed so that the time constant is larger than any of the breakdown times of the first ESD protection element 10, the second ESD protection element 20, the third ESD protection element 30, and the fourth ESD protection element 40.

It is preferable that the resistance Rb of the fifth surge current path Sur5 is adjusted to meet the demand regarding the above described resistance divider ratio. However, it is not preferable that it is adjusted to meet the condition of the above described time constant. Therefore, the parameter that should be adjusted to meet the condition of the time constant is the capacitance of the input of the second protection logic circuit INV2, more specifically, the gate capacitance Cp of the PMOS transistor Trp2 and the gate capacitance Cn of the NMOS transistor Trn2. The gate capacitance C is proportional to area S of the gate electrode. The area S of the gate electrode is derived by product of the gate length L and the gate width W (i.e., S=LW). It is difficult to adjust the gate length L to meet the condition of the time constant because the gate length L depends on a manufacturing process. Therefore, the parameter that can be adjusted to meet the condition of the time constant is the gate width W. Thus, the gate widths of the PMOS transistor Trp2 and the NMOS transistor Trn2 which comprise the second protection logic circuit INV2 are adjusted.

In other words, it is possible to avoid destruction of the gates of the transistors of the interface logic circuits INV-B1 . . . INV-Bn by adjusting the gate widths of the PMOS transistor Trp2 and the NMOS transistor Trn2 which comprise the second protection logic circuit INV2, and by setting the time constant of the input of the second protection logic circuit INV2 to be longer than any of the breakdown times of the first ESD protection element 10, the second ESD protection element 20, the third ESD protection element 30, and the fourth ESD protection element 40.

As described above, it is possible to avoid destruction of the gates of the transistors of the interface logic circuits INV-B1 . . . INV-Bn belonging to the second power supply system by setting the input of the second protection logic circuit INV2 belonging to the second power supply system to have a time constant that is longer than any of the breakdown times of the first ESD protection element 10, the second ESD protection element 20, the third ESD protection element 30, and the fourth ESD protection element 40. Here, it is possible to avoid destruction of the gates of transistors of the interface logic circuits INV-B1 . . . INV-Bn by providing one protection logic circuit (i.e., the second protection logic circuit INV2) having the above described time constant with respect to the plurality of the interface logic circuits INV-B1 . . . INV-Bn. In other words, the number of the second protection logic circuits INV2 does not have to be the same as the number of the interface logic circuits INV-B1 . . . INV-Bn, and it is possible to avoid destruction of the gates of the transistors of the interface logic circuits INV-B1 . . . INV-Bn if at least one second protection logic circuit INV2 is provided. This leads to avoidance of an increase in the area occupied by the protection circuits.

In the above described example, one second protection logic circuit INV2 is provided with respect to n interface logic circuits INV-B1 . . . INV-Bn belonging to the second power supply system for the purpose of reducing the area occupied by the protection circuit as much as possible. However, it is effective for reducing the area occupied by the protection circuits even if n−1 second protection logic circuits INV2 are provided with respect to n interface logic circuits INV-B1 . . . INV-Bn belonging to the second power supply system. In other words, it is effective for reducing the area occupied by the protection circuit even if fewer than n number of second protection logic circuit(s) INV2, that is, the number of the interface logic circuits INV-B1 . . . INV-Bn belonging to the second power supply system, is (are) provided.

The second protection logic circuit INV2 belonging to the second power supply system is coupled to the first protection logic circuit INV1 belonging to the first power supply system through the fifth surge current path Sur5. In addition, in the second protection logic circuit INV2 belonging to the second power supply system, the input coupled to the fifth surge current path Sur5 has a time constant that is longer than any of the breakdown times of the ESD protection elements coupled between the high potential line and the low potential line, both of which belong to the first power supply system, and between the high potential line and the low potential line, both of which belong to the second power supply system. Therefore, the above described first protection logic circuit INV1 and the second protection logic circuit INV2 prevent the gates of the transistors of the interface logic circuits INV-B1 ... INV-Bn and the second ESD protection logic circuit INV2, both of which are included in the second interface 200 belonging to the second power supply system from being destroyed until breakdown occurs in either of the first to fourth ESD protection transistors Tr10 to Tr40 since surge current has been applied. In addition, the first protection logic circuit(s) INV1 and the second protection logic circuit(s) INV2 must be provided, both numbers of which are less than the plurality of the interface logic circuits INV-B1 ... INV-Bn, for the purpose of protecting the gates of the interface logic circuits INV-B1 ... INV-Bn. This makes it possible to prevent an increase in area occupied by circuits.

Operation of ESD Protection Circuit

Circuit actions after the application of surge current will be hereinafter briefly explained. Surge current is applied to either of the first power supply line VDD1, the first ground line GND1, the second power supply line VDD2, and the second ground line GND2 when the above described semiconductor IC has not been incorporated in a product yet. In this state, any of the first ground line GND1, the second power supply line VDD2, and the second ground line GND2 is in a floating state. When the semiconductor IC is incorporated in a product and can operate, surge current is not applied to either of the first power supply line VDD1, the first ground line GND1, the second power supply line VDD2, and the second ground line GND2. In general, it often happens that positive polarity surge voltage is generated. Therefore, the following explanation is limited to a situation in which positive polarity surge voltage is generated. However, the following explanation can be correspondingly applied to a circuit action performed when negative surge voltage is generated.

When positive polarity surge is generated in first power supply line VDD1 based on second power supply line VDD2

As shown in FIG. 2, immediately after positive polarity surge is generated in the first power supply line VDD1, the first ESD protection transistor Tr10 comprising the first ESD protection element 10 electrically separates the first power supply line VDD1 and the second power supply line VDD2 from each other. Therefore, surge current is passed through the outputs of the first to n-th interface logic circuits INV-A1 ... INV-An and the first protection logic circuit INV1 through the PMOS transistors TrpA1. TrpAn of the first to n-th interface logic circuits INV-A1 ... INV-An which belong to the first power supply system and the PMOS transistor Trp1 of the first protection logic circuit INV1 that belongs to the first power supply system. In addition, surge current is passed through the inputs of the interface logic circuits INV-B1 ... INV-Bn which belong to the second power supply system and the input of the second protection logic circuit INV2 which belongs the second power supply system through the signal lines S1 ... Sn and the fifth surge current path Sur5.

However, as described above, the resistance divider ratio is defined so that most of the surge current is passed through the gates of the PMOS transistor Trp2 and the NMOS transistor Trn2 of the second protection logic circuit INV2 belonging to the second power supply system. In other words, most of the surge current is received by the input of the second protection logic circuit INV2. As described above, the input of the second protection logic circuit INV2 has a time constant that is longer than the time until breakdown occurs in the first ESD protection transistor Tr10 since surge current has been applied to the first power supply line VDD1. Therefore, most of the surge current applied to the first power supply line VDD1 is passed through the input of the second protection logic circuit INV2, and the gate capacitance provided by the input of the second protection logic circuit INV2 is charged. Even if breakdown does not occur in the first ESD protection transistor Tr10, as long as the above described charge is continued, the gates of the PMOS transistors TrpB1 ... TrpBn and the NMOS transistor TrnB1. TrnBn, both of which belong to the second power supply system, are not destroyed.

The charge of the gate capacitance is completed by continuing the charge for the amount of time corresponding to the time constant of the input of the second protection logic circuit INV2. However, as described above, the breakdown time in the first ESD protection transistor Tr10 is shorter than the time constant of the input of the second protection logic circuit INV2. This assures that breakdown occurs in the first ESD protection transistor Tr10 before the amount of time corresponding to the time constant is elapsed. Once breakdown occurs in the first ESD protection transistor Tr10, most of the surge current is passed through the second power supply line VDD2 from the first power supply line VDD1 through the first ESD protection transistor Tr10 in which breakdown occurs. Therefore, the gates of the PMOS transistors TrpB1 .... TrpBn and the NMOS transistors TrnB1 ... TrnBn of the interface logic circuits INV-B1 ... INV-Bn belonging to the second power supply system are not destroyed.

When positive polarity surge is generated in first power supply line VDD1 based on second ground line GND2

As shown in FIG. 2, immediately after positive polarity surge is generated in the first power supply line VDD1, the second ESD protection transistor Tr20 comprising the second ESD protection element 20 electrically separates the first power supply line VDD1 and the second power supply line VDD2 from each other. Therefore, surge current is passed through the outputs of the first to n-th interface logic circuits INV-A1 ... INV-An and the first protection logic circuit INV1 through the PMOS transistors TrpA1 ... TrpAn of the first to n-th interface logic circuits INV-A1 ... INV-An which belong to the first power supply system and the PMOS transistor Trp1 of the first protection logic circuit INV1 that belongs to the first power supply system. In addition, surge current is passed through the inputs of the interface logic circuits INV-B1 ... INV-Bn which belong to the second power supply system and the input of the second protection logic circuit INV2 which belongs the second power supply system through the signal lines S1 ... Sn and the fifth surge current path Sur5, respectively.

However, as described above, the resistance divider ratio is defined so that most of the surge current is passed through the gates of the PMOS transistor Trp2 and the NMOS transistor Trn2 of the second protection logic circuit INV2 belonging to the second power supply system. In other words, most of the surge current is received by the input of the second protection logic circuit INV2. As described above, the input of the second protection logic circuit INV2 has a time constant that is longer than the time until breakdown occurs in the second ESD protection transistor Tr20 since surge current has been applied to the first power supply line VDD1. Therefore, most of the surge current applied to the first power supply line VDD1 is passed through the input of the second protection logic circuit INV2, and the gate capacitance provided by the input of the second protection logic circuit INV2 is charged. Even if breakdown does not occur in the second ESD protection transistor Tr20, as long as the above described charge is continued, the gates of the PMOS transistors TrpB1 . . . TrpBn and the NMOS transistor TrnB1 . . . TrnBn, both of which belong to the second power supply system, are not destroyed.

The charge of the gate capacitance is completed by continuing the charge for the amount of time corresponding to the time constant of the input of the second protection logic circuit INV2. However, as described above, the breakdown time in the second ESD protection transistor Tr20 is shorter than the time constant of the input of the second protection logic circuit INV2. This assures that breakdown occurs in the second ESD protection transistor Tr20 before the amount of time corresponding to the time constant is elapsed. Once breakdown occurs in the second ESD protection transistor Tr20, most of the surge current is passed through the second ground line GND2 from the first power supply line VDD1 through the second ESD protection transistor Tr20 in which breakdown occurs. Therefore, the gates of the PMOS transistors TrpB1 . . . TrpBn and the NMOS transistors TrnB1. TrnBn of the interface logic circuits INV-B1 . . . INV-Bn belonging to the second power supply system are not destroyed.

When positive surge is generated in first ground line GND1 based on the second ground line GND2

As shown in FIG. 2, immediately after positive polarity surge is generated in the first ground line GND1, the first and second anti-parallel coupled diodes D1 and D2 that comprise the third ESD protection element 30 electrically separate the first ground line GND1 and the second ground line GND2 from each other. Therefore, surge current is passed through the outputs of the first to n-th interface logic circuits INV-A1 . . . INV-An and the first protection logic circuit INV1 through the NMOS transistors TrnA1 . . . TrnAn of the first to n-th interface logic circuits INV-A1 . . . INV-An which belong to the first power supply system, and the NMOS transistor Trn1 of the first protection logic circuit INV1 that belongs to the first power supply system. In addition, surge current is passed through the inputs of the interface logic circuits INV-B1 . . . INV-Bn which belong to the second power supply system, and the input of the second protection logic circuit INV2 which belongs the second power supply system, through the signal lines S1 . . . Sn and the fifth surge current path Sur5, respectively.

However, as described above, the resistance divider ratio is defined so that most of the surge current is passed through the gates of the PMOS transistor Trp2 and the NMOS transistor Trn2 of the second protection logic circuit INV2 belonging to the second power supply system. In other words, most of the surge current is received by the input of the second protection logic circuit INV2. As described above, the input of the second protection logic circuit INV2 has a time constant that is longer than the time until breakdown occurs in the first diode D1 since surge current has been applied to the first ground line GND1. Therefore, most of the surge current applied to the first ground line GND1 is passed through the input of the second protection logic circuit INV2, and the gate capacitance provided by the input of the second protection logic circuit INV2 is charged. Even if breakdown does not occur in the first diode D1, as long as the above described charge is continued, the gates of the PMOS transistors TrpB1 . . . TrpBn and the NMOS transistors TrnB1 . . . TrnBn, both of which belong to the second power supply system, are not destroyed. The charge of the gate capacitance is completed by continuing the charge for the amount of time corresponding to the time constant of the input of the second protection logic circuit INV2. However, as described above, the breakdown time in the diode D1 is shorter than the time constant of the input of the second protection logic circuit INV2. This assures that breakdown occurs in the first diode D1 before the amount of time corresponding to the time constant is elapsed. Once breakdown occurs in the first diode D1, most of the surge current is passed through the second ground line GND2 from the first ground line GND1 through the first diode D1 in which breakdown occurs. Therefore, the gates of the PMOS transistors TrpB1 . . . . TrpBn and the NMOS transistors TrnB1 . . . TrnBn of the interface logic circuits INV-B1 . . . INV-Bn belonging to the second power supply system are not destroyed. When positive polarity surge is generated in first ground line GND1 based on second power supply line VDD2

As shown in FIG. 2, immediately after positive polarity surge is generated in the first ground line GND1, the fourth ESD protection transistor Tr40 comprising the fourth ESD protection element 40 electrically separates the second power supply line VDD2 and the first ground line GND1 from each other. Therefore, surge current is passed through the outputs of the first to n-th interface logic circuits INV-A1 . . . INV-An and the first protection logic circuit INV1 through the NMOS transistors TrnA1 . . . TrnAn of the first to n-th interface logic circuits INV-A1 . . . INV-An which belong to the first power supply system and the NMOS transistor Trn1 of the first protection logic circuit INV1 that belongs to the first power supply system. In addition, surge current is passed through the inputs of the interface logic circuits INV-B1 . . . INV-Bn which belong to the second power supply system and the input of the second protection logic circuit INV2 which belongs the second power supply system through the signal lines S1 . . . Sn and the fifth surge current path Sur5. However, as described above, the resistance divider ratio is defined so that most of the surge current is passed through the gates of the PMOS transistor Trp2 and the NMOS transistor Trn2 of the second protection logic circuit INV2 belonging to the second power supply system. In other words, most of the surge current is received by the input of the second protection logic circuit INV2. As described above, the input of the second protection logic circuit INV2 has a time constant that is longer than the time until breakdown occurs in the fourth ESD protection transistor Tr40 since surge current has been applied to the first ground line GND1. Therefore, most of the surge current applied to the first ground line GND1 is passed through the input of the second protection logic circuit INV2, and the gate capacitance provided by the input of the second protection logic circuit INV2 is charged. Even if breakdown does not occur in the fourth ESD protection transistor Tr40, as long as the above described charge is continued, the gates of the PMOS transistors TrpB1 . . . TrpBn and the NMOS transistor TrnB1 . . . TrnBn, both of which belong to the second power supply system, are not destroyed.

The charge of the gate capacitance is completed by continuing the charge for the amount of time corresponding to the time constant of the input of the second protection logic circuit INV2. However, as described above, the breakdown time in the fourth ESD protection transistor Tr40 is shorter than the time constant of the input of the second protection logic circuit INV2. This assures that breakdown occurs in the fourth ESD protection transistor Tr40 before the amount of time corresponding to the time constant is elapsed. Once breakdown occurs in the fourth ESD protection transistor Tr40, most of the surge current is passed through the second power supply line VDD2 from the first ground line GND1 through the fourth ESD protection transistor Tr40 in which breakdown occurs. Therefore, the gates of the PMOS transistors TrpB1 ... TrpBn and the NMOS transistors TrnB1 ... TrnBn of the interface logic circuits INV-B1 ... INV-Bn belonging to the second power supply system are not destroyed.

When positive polarity surge is generated in second power supply line VDD2 based on the first power supply line VDD1

As shown in FIG. 2, immediately after positive polarity surge is generated in the second power supply line VDD2, the first ESD protection transistor Tr10 comprising the first ESD protection element 10 electrically separates the first power supply line VDD1 and the second power supply line VDD2 from each other. However, the positive polarity surge is not applied to the gates of the transistors of the first to n-th interface logic circuits INV-A1 ... INV An belonging to the first power supply system, the gate of the transistor of the first protection logic circuit INV1 belonging to the first power supply system, the gates of the transistors of the interface logic circuits INV-B1 ... INV-Bn belonging to the second power supply system, and the gate of the transistor of the second protection logic circuit INV2 belonging to the second power supply system. Therefore, the gates of these transistors are not destroyed. Breakdown occurs in the first ESD protection transistor Tr10 after the positive polarity surge is applied to the second power supply line VDD2 and then the breakdown time of the first ESD protection transistor Tr10 is elapsed. Therefore, the positive polarity surge is passed through the first power supply line VDD1 from the second power supply line VDD2 through the first ESD protection transistor Tr10 in which breakdown occurs. Because of this, the gates of the PMOS transistors TrpB1 ... TrpBn and the NMOS transistor TrnB1 ... TrnBn of the interface logic circuits INV-B1 ... INV-Bn belonging to the second power supply system are not destroyed.

When positive polarity surge is generated in second power supply line VDD2 based on the first ground line GND1

As shown in FIG. 2, immediately after positive polarity surge is generated in the second power supply line VDD2, the fourth ESD protection transistor Tr40 comprising the fourth ESD protection element 40 electrically separates the first ground line GND1 and the second power supply line VDD2 from each other. However, the positive polarity surge is not applied to the gates of the transistors of the first to n-th interface logic circuits INV-A1 ... INV An belonging to the first power supply system, the gate of the transistor of the first protection logic circuit INV1 belonging to the first power supply system, the gates of the transistors of the interface logic circuits INV-B1 ... INV-Bn belonging to the second power supply system, and the gate of the transistor of the second protection logic circuit INV2 belonging to the second power supply system. Therefore, the gates of these transistors are not destroyed. Breakdown occurs in the fourth ESD protection transistor Tr40 after the positive polarity surge is applied to the second power supply line VDD2 and then the breakdown time of the fourth ESD protection transistor Tr40 is elapsed. Therefore, the positive polarity surge is passed through the first ground line GND1 from the second power supply line VDD2 through the fourth ESD protection transistor Tr40 in which breakdown occurs. Because of this, the gates of the PMOS transistors TrpB1 ... TrpBn and the NMOS transistor TrnB1. TrnBn of the interface logic circuits INV-B1 ... INV-Bn belonging to the second power supply system are not destroyed.

When positive polarity surge is generated in second ground line GND2 based on the first power supply line VDD1

As shown in FIG. 2, immediately after positive polarity surge is generated in the second ground line GND2, the second ESD protection transistor Tr20 comprising the second ESD protection element 20 electrically separates the first power supply line VDD1 and the second ground line GND2 from each other. However, the positive polarity surge is not applied to the gates of the transistors of the first to n-th interface logic circuits INV-A1 ... INV An belonging to the first power supply system, the gate of the transistor of the first protection logic circuit INV1 belonging to the first power supply system, the gates of the transistors of the interface logic circuits INV-B1 ... INV-Bn belonging to the second power supply system, and the gate of the transistor of the second protection logic circuit INV2 belonging to the second power supply system. Therefore, the gates of these transistors are not destroyed. Breakdown occurs in the second ESD protection transistor Tr20 after the positive polarity surge is applied to the second ground line GND2 and then the breakdown time of the second ESD protection transistor Tr20 is elapsed. Therefore, the positive polarity surge is passed through the first power supply line VDD1 from the second ground line GND2 through the second ESD protection transistor Tr20 in which breakdown occurs. Because of this, the gates of the PMOS transistors TrpB1 ... TrpBn and the NMOS transistor TrnB1 ... TrnBn of the interface logic circuits INV-B1 ... INV-Bn belonging to the second power supply system are not destroyed.

When positive polarity surge is generated in second ground line GND2 based on the first ground line GND1

As shown in FIG. 2, immediately after positive polarity surge is generated in the second ground line GND2, the second diode D2 comprising the third ESD protection element 30 electrically separates the first ground line GND1 and the second ground line GND2 from each other. However, the positive polarity surge is not applied to the gates of the transistors of the first to n-th interface logic circuits INV-A1 ... INV An belonging to the first power supply system, the gate of the transistor of the first protection logic circuit INV1 belonging to the first power supply system, the gates of the transistors of the interface logic circuits INV-B1 ... INV-Bn belonging to the second power supply system, and the gate of the transistor of the second protection logic circuit INV2 belonging to the second power supply system. Therefore, the gates of these transistors are not destroyed. Breakdown occurs in the second diode D2 after the positive polarity surge is applied to the second ground line GND2 and then the breakdown time of the second diode D2 is elapsed. Therefore, the positive polarity surge is passed through the first ground line GND1 from the second ground line GND2 through the second diode D2. Because of this, the gates of the PMOS transistors TrpB1 ... TrpBn and the NMOS transistor TrnB1 ... TrnBn of the interface logic circuits INV-B1 ... INV-Bn belonging to the second power supply system are not destroyed.

As described above, in the ESD protection circuit configuration, which is arranged to protect the first interface 100 and the second interface 200 from surge current, both of which are independent from each other and belong to different power supply systems, the second protection logic circuit INV2 belonging to the second power supply system is coupled to the first protective logic circuit INV1 belonging to the first power supply system through the fifth surge current path Sur5. In addition, it is important for the input of the second protection logic circuit INV2 belonging to the second power supply system to have a time constant that is longer than any of the breakdown times of the ESD protection elements coupled among the high potential line and the low potential line, both of which belong to the first power supply system, and the high potential line and the low potential line, both of which belong to the second power supply system. Typical design examples of the above described ESD protection circuits will be hereinafter explained in detail.

Design of First Protection Logic Circuit

As described above, the first protection logic circuit INV1 belonging to the first power supply system provides a surge current path to transmit the surge current to the second protection logic circuit INV2 belonging to the second power supply system. Based on this point, there is no constraint with respect to the dimension, especially the gate length L and the gate width W of the PMOS transistor Trp1 and the NMOS transistor Trn1, both of which comprise the first protection logic circuit INV1.

However, as described above, most of the surge current is passed through the gates of the transistors of the interface logic circuits INV-B1 . . . INV-Bn belonging to the second power supply system, and the second protection logic circuit INV2 belonging to the second power supply system, based on the above described resistance divider ratio until breakdown occurs in either of the first to fourth ESD protection elements 10 to 40 after surge current has been applied to the first power supply line VDD1 or the first ground line GND1. The gates of the transistors of the interface logic circuits INV-B1 . . . INV-Bn are not destroyed while the gate capacitance of the input of the second protection logic circuit INV2 is charged with the surge current. In addition, the gates of the transistors of the interface logic circuits INV-B1 . . . INV-Bn are not destroyed after breakdown occurs in either of the first to fourth ESD protection elements 10 to 40 and then surge current paths are formed among the first power supply line VDD1, the first ground line GND1, the second power supply line VDD2, and the second ground line GND2. Therefore, it is possible to avoid destruction of the gates of the transistors of the interface logic circuits INV-B1 . . . INV-Bn when the input of the second protection logic circuit INV2 has a time constant that is longer than the time until breakdown occurs in either of the first to fourth ESD protection elements 10 to 40 since surge current has been applied to either of the first power supply line VDD1, the first ground line GND1, the second power supply line VDD2, and the second ground line GND2.

From the perspective that the above described resistance divider ratio is not influenced by the dimension of the first protection logic circuit INV1, it is preferable that the dimensions, especially the gate length L and the gate width W of the first protection logic circuit INV1, and specifically the dimensions of the PMOS transistor Trp1 and the NMOS transistor Trn1, both of which comprise the first protection logic circuit INV1, should be set to be the same as the dimensions of the gate length L and the gate width W of the PMOS transistors TrpA1. TrpAn and the NMOS transistors TrnA1 . . . TrnAn, both of which comprise the first to n-th interface logic circuits INV-A1 . . . INV-An belonging to the first power supply system. However, it is not necessarily required to meet this condition.

Design of Second Protection Logic Circuit

As described above, the time constant of the input of the second protection logic circuit INV2 is derived by the product of the sum of the gate capacitance Cp of the PMOS transistor Trp2 and the gate capacitance Cn of the NMOS transistor Trn2 (i.e., C=Cp+Cn) and the resistance RB of the fifth surge current path Sur5 that couples the output of the first protection logic circuit INV1 and the second protection logic circuit INV2. That is, the time constant of the input of the second protection logic circuit INV2 is expressed by C times RB. The gates of the PMOS transistor Trp2 and the NMOS transistor Trn2 are designated so that the time constant is longer than any of the breakdown times of the first to fourth ESD protection elements 10 to 40.

It is preferable for the resistance RB of the fifth surge current path Sur5 to be adjusted so that demands regarding the above described resistance divider ratio are met. However, it is not preferable for the resistance RB of the fifth surge current path Sur5 to be adjusted so that conditions of the above described time constant are met. The parameter that should be adjusted to meet the conditions of the time constant is the capacitance of the input of the second protection logic circuit INV2, specifically the gate capacitance Cp of the PMOS transistor Trp2 and the gate capacitance Cn of the NMOS transistor Trn2. The gate capacitance C is proportional to the area S of the gate electrode. The area S of the gate electrode is derived by the product of the gate length L and the gate width W (i.e., S=LW). The gate length L depends on the manufacturing process, and thus it is difficult to adjust the gate length L so that it meets the conditions of the time constant. Therefore, the parameter that can be adjusted to meet the conditions of the time constant is the gate width W. Accordingly, the gate widths of the PMOS transistor Trp2 and the NMOS transistor Trn2, both of which comprise the second protection logic circuit INV2, are adjusted. In other words, the gate widths of the PMOS transistor Trp2 and the NMOS transistor Trn2, both of which comprise the second protection logic circuit INV2, are adjusted so that the input of the second protection logic circuit INV2 has a time constant that is longer than the breakdown times of the first to fourth ESD protection elements 10 to 40.

Note that the gate capacitance (C_Pinv2) of the PMOS transistor Trp2 and the gate capacitance (C_Ninv2) of the NMOS transistor Trn2 are estimated by the following formulas.

$$C\_Pinv2 = \in \times S/d = \in \times (L \times W)/d = \{(\in \times L)/d\} \times W\_Pinv2$$

$$C\_Ninv2 = \in \times S/d = \in \times (L \times W)/d = \{(\in \times L)/d\} \times W\_Ninv2$$

$\in$: dielectric constant (depending on material and a process)

L: the gate length (depending on a process rule)

d: thickness of the gate insulation film (depending on a process)

W_Pinv2: the gate width of the PMOS transistor Trp2

W_Ninv2: the gate width of the NMOS transistor Trn2

In addition, in consideration of simulation results and experimental results as additional conditions, the gate widths of the PMOS transistor Trp2 and the NMOS transistor Trn2, both of which comprise the second protection logic circuit INV2, may be adjusted. Based on these results, the following conditions are derived for the gate widths of the PMOS transistor Trp2 and the NMOS transistor Trn2, both of which comprise the second protection logic circuit INV2.

$$W\_Pinv2 \geq 450 \, \mu m - \Sigma PWn$$

$$W\_Ninv2 \geq 450 \, \mu m - \Sigma NWn$$

ΣPWn: the sum of the gate widths of the PMOS transistors TrpB1 . . . TrpBn of the interface logic circuits INV-B1 . . . INV-Bn belonging to the second power supply system ΣNWn: the sum of the gate widths of the NMOS transistors TrnB1 . . . TrnBn of the interface logic circuits INV-B1 . . . INV-Bn belonging to the second power supply system Note that the above described value "450 µm" is effective in a 0.16 µm process and other values are effective in the other processes (e.g., 0.22 µm and 0.15 µm).

Based on the above described conditions, a constrained condition will be derived for the gate width W_Ninv2 of the NMOS transistor Trn2.

$$C\_Ninv2 >> Td/RB$$

$$\{(\in \times 1)/d\} \times W\_Ninv2 >> Td/RB$$

$$W\_Ninv2 >> (Td/RB) \times d/(\in \times 1)$$

Td: maximum of the breakdown times of the first to fourth ESD protection elements 10 to 40

RB: the gate resistance of the NMOS transistor Trn2

As described above, d, L, and ∈ depends on a process.

Therefore, it is preferable that the gate width W_Ninv2 of the NMOS transistor Trn2 of the second protection logic circuit INV2 is derived so that it meets the constrained conditions expressed by the following two formulas.

$$W\_Ninv2 \leq 450 \, \mu m - \Sigma NWn \quad \text{Formula (1)}$$

$$W\_Ninv2 >> (Td/RB) \times d/(\in \times 1) \quad \text{Formula (2)}$$

In addition, based on the above described premises, a constrained condition is derived for the gate width W_Pinv2 of the PMOS transistor Trp2.

$$C\_Pinv2 >> Td/RB$$

$$\{(\in \times 1)/d\} \times W\_PNinv2 >> Td/RB$$

$$W\_Pinv2 >> (Td/RB) \times d/(\in \times 1)$$

Td: maximum of the breakdown times of the first to fourth ESD protection elements 10 to 40

RB: the gate resistance of the NMOS transistor Trn2

As described above, d, L, and depend on the manufacturing process used.

Therefore, it is preferable that the gate width W_Pinv2 of the PMOS transistor Trp2 of the second protection logic circuit INV2 is derived so that it meets the constrained conditions expressed by the following two formulas.

$$W\_Pinv2 \geq 450 \, \mu m - \Sigma PWn \quad \text{Formula (3)}$$

$$W\_Pinv2 >> (Td/RB) \times d/(\in \times 1) \quad \text{Formula (4)}$$

If 100 interface logic circuits that receive 100 interface signals are provided between the first power supply system and the second power supply system in a 0.16 µm process, and the gate widths of the NMOS transistors included in the interface logic circuits are formed to be 2 µm, the gate width W_Ninv2 of the NMOS transistor Trn2 is calculated with the above described formula (1) as follows.

$$W\_Ninv2 \geq 450 \, \mu m - \Sigma NWn = 450 \, \mu m - 100 \times 2 \, \mu m = 250 \, \mu m$$

Therefore, the relation of "W_Ninv2≧250 µm" holds true.

Similarly, if 100 interface logic circuits that receive 100 interface signals are provided between the first power supply system and the second power supply system in a 0.16 µm process and the gate widths of the PMOS transistors included in the interface logic circuits are formed to be 2 µm, the gate width W_Pinv2 of the PMOS transistor Trp2 is calculated with the above described formula (3) as follows.

$$W\_Pinv2 \geq 450 \, \mu m - \Sigma PWn = 450 \, \mu m - 100 \times 2 \, \mu m = 250 \, \mu m$$

Therefore, the relation of "W_Pinv2≧250 µm" holds true.

If 89 interface logic circuits that receive 89 interface signals are provided between the first power supply system and the second power supply system in a 0.16 µm process and the gate widths of the NMOS transistors included in the interface logic circuits are formed to be 5 µm, the gate width W_Ninv2 of the NMOS transistor Trn2 is calculated with the above described formula (1) as follows.

$$W\_Ninv2 \geq 450 \, \mu m - \Sigma NWn = 450 \, \mu m - 89 \times 5 \, \mu m = 5 \, \mu m$$

Therefore, the relation of "W_Ninv2≧5 µm" holds true.

Similarly, if 89 interface logic circuits that receive 89 interface signals are provided between the first power supply system and the second power supply system in a 0.16 µm process and the gate widths of the PMOS transistors included in the interface logic circuits are formed to be 5 µm, the gate width W_Pinv2 of the PMOS transistor Trp2 is calculated with the above described formula (3) as follows.

$$W\_Pinv2 \geq 450 \, \mu m - \Sigma PWn = 450 \, \mu m - 89 \times 5 \, \mu m = 5 \, \mu m$$

Therefore, the relation of "W_Pinv2≧5 µm" holds true.

If two interface logic circuits that receive two interface signals are provided between the first power supply system and the second power supply system in a 0.16 µm process and the gate widths of the NMOS transistors included in the interface logic circuits are formed to be 5 µm, the gate width W_Ninv2 of the NMOS transistor Trn2 is calculated with the above described formula (1) as follows.

$$W\_Ninv2 \geq 450 \, \mu m - \Sigma NWn = 450 \, \mu m - 2 \times 5 \, \mu m = 440 \, \mu m$$

Therefore, the relation of "W_Ninv2≧440 µm" holds true.

Similarly, if two interface logic circuits that receive two interface signals are provided between the first power supply system and the second power supply system in a 0.16 µm process and the gate widths of the PMOS transistors included in the interface logic circuits are formed to be 5 µm, the gate width W_Pinv2 of the PMOS transistor Trp2 is calculated with the above described formula (3) as follows.

$$W\_Pinv2 \geq 450 \, \mu m - \Sigma PWn = 450 \, \mu m - 2 \times 5 \, \mu m = 440 \, \mu m$$

Therefore, the relation of "W_Pinv2≧440 µm" holds true.

Similarly, the case in which the 0.16 µm process rule is applied to formulas (2) and (4) is considered. Here, the gate width W_Ninv2 of the NMOS transistor Trn2 and the gate width W_Pinv2 of the PMOS transistor Trp2 are calculated by setting the parameters other than the gate length L (i.e., 0.16 µm) as follows.

d: thickness of the gate insulation film: 1000 nm

∈: dielectric constant: 8.85 E-12×4

RB: the gate protection resistance: 1000 Q $$W\_Ninv2 \gg (Td/RB) \times d/(\varepsilon \times 1)$$
$$= (Td/1000) \times 1000 \text{ nm}/(8.85E-12 \times 4 \times 0.16 \text{ μm})$$
$$= (Td/1000) \times 1000 \text{ nm}/5.66E-18$$
$$= Td \times 1.77E+8$$

Therefore, the relation of "W_Ninv2>>Td×1.77E+8" holds true.

$$W\_Pinv2 \gg (Td/RB) \times d/(\varepsilon \times 1)$$
$$= (Td/1000) \times 1000 \text{ nm}/(8.85E-12 \times 4 \times 0.16 \text{ μm})$$
$$= (Td/1000) \times 1000 \text{ nm}/5.66E-18$$
$$= Td \times 1.77E+8$$

Therefore, the relation of "W_Pinv2>>Td×1.77E+8" holds true.

Td: maximum of the breakdown times of the first to fourth ESD protection elements 10 to 40.

Note that the breakdown times of the first to fourth ESD protection elements 10 to 40 depend on the manufacturing process thereof.

As described above, if simulation results and experimental results are considered, it is preferable that the dimensions of the gates of the PMOS transistor Trp2 and the NMOS transistor Trn2, both of which comprise the second protection logic circuit INV2 belonging to the second power supply system, are set in view of the sum of the gate widths of the transistors comprising the interface logic circuits INV-B1 ... INV-Bn belonging to the second power supply system in addition to the breakdown times of the first to fourth ESD protection elements 10 to 40.

Design and manufacturing of the second protection logic circuit will be easier if the first to n-th interface logic circuits INV-A1 ... INV-An belonging to the first power supply system and the first protection logic circuit INV1 belonging to the first power supply system are comprised of CMOS inverters comprised of transistors with the same dimension. Here, the CMOS inverter comprising the first protection logic circuit INV1 can be assumed to be a dummy logic gate, not a logic gate that performs signal processing.

Referring now to FIGS. 3 to 8, semiconductor ICs in accordance with alternative embodiments will now be described. In view of the similarity between the first embodiment and the alternative embodiments, the parts of the alternative embodiments that are identical to the parts of the first embodiment will be given the same reference numerals as the parts of the first embodiment. Moreover, the descriptions of the parts of the alternative embodiments that are identical to the parts of the first embodiment may be omitted for the sake of brevity.

First Alternative Embodiment

As described above, it is important that the second protection logic circuit INV2 belonging to the second power supply system is coupled to the first protection logic circuit INV1 belonging to the first power supply system through the fifth surge current path Sur5. In addition, it is important that the input of the second protection logic circuit INV2 belonging to the second power supply system, which is coupled to the fifth surge current path Sur5, has a time constant that is longer than any of the breakdown achievement times of the ESD protection elements coupled between the high potential line and the low potential line, both of which belong to the first power supply system, and between the high potential line and the low potential line, both of which belong to the second power supply system. Therefore, it is desirable for the second protection logic circuit belonging to the second power supply system to meet the above two conditions. Accordingly, the second protection logic circuit belonging to the second power supply system is not necessarily comprised of a CMOS inverter circuit and can be comprised of other logic gates as long as the above two conditions are met.

Figure 3:
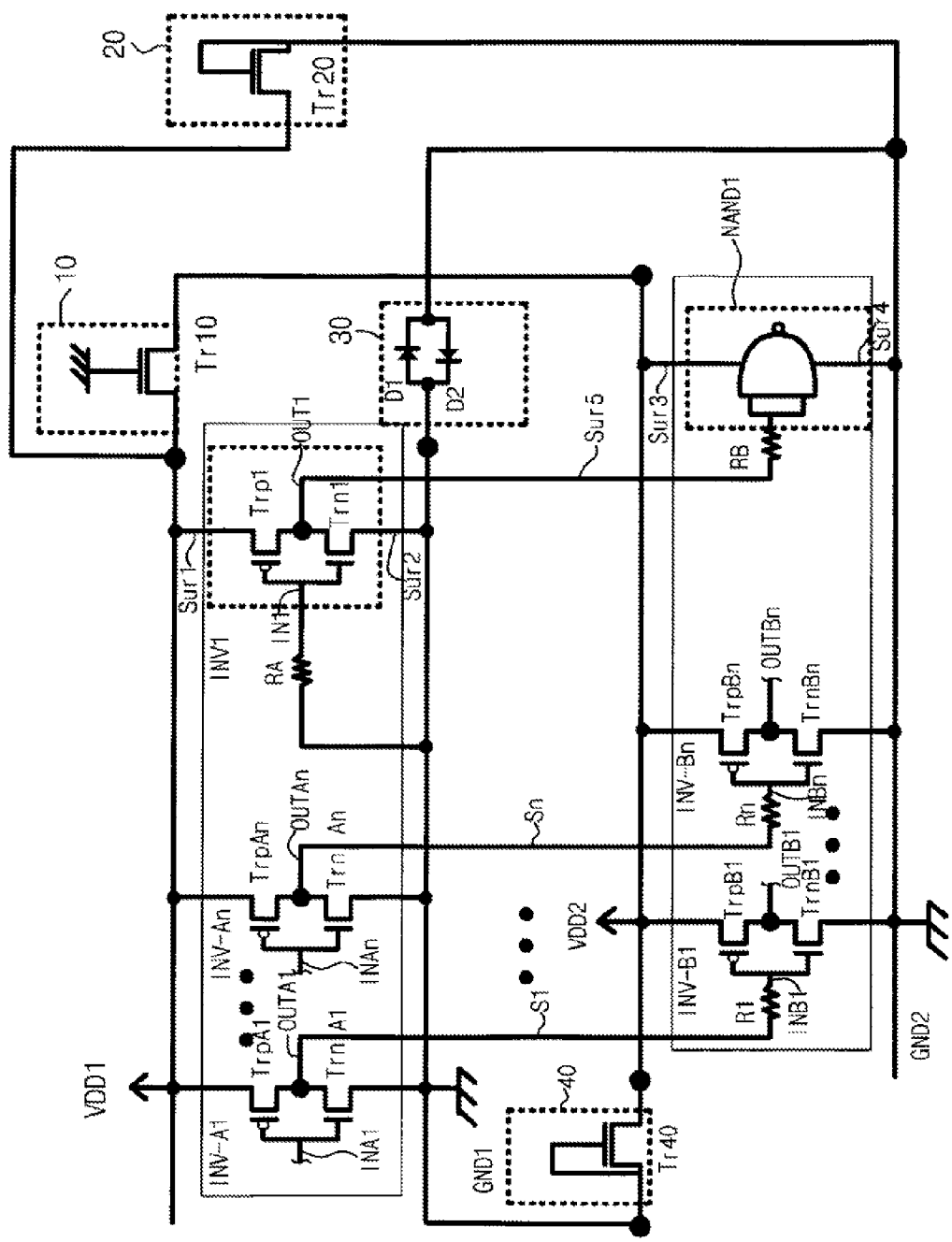
FIG. 3 is an equivalent circuit schematic of an ESD protection circuit included in an interface in accordance with a first alternative embodiment with respect to the first embodiment of the present invention.

As the other typical examples of the logic gate, an NOR gate and an NAND gate can be suggested. FIG. 3 is an equivalent circuit diagram of an ESD protection circuit included in the interface in accordance with a first alternative embodiment for the first embodiment of the present invention. One difference between the circuit in accordance with the first alternative embodiment shown in FIG. 3 and the circuit in accordance with the first embodiment shown in FIG. 2 is in that the second protection logic circuit belonging to the second power supply system is comprised of a dummy NAND gate NAND1 that does not have any output. One (i.e., a first input) of two inputs of the NAND gate NAND1 is coupled to the fifth surge current path Sur5, and the other (i.e., a second input) is floated or coupled to either of the second power supply line VDD2 and the second ground line GND2. In addition, the NAND gate NAND1 is formed not to have any output. The NAND gate NAND1 is coupled to the second power supply line VDD2 through the third surge current path Sur3. In addition, the NAND gate NAND1 is coupled to the second ground line GND2 through the fourth surge current path Sur4.

The NAND gate NAND1 is comprised of a plurality of transistors. The input of the NAND gate NAND1 is comprised of the gate of a transistor. Therefore, the first input of the NAND gate NAND1 provides a gate capacitance. In addition, the fifth surge current path Sur5 has a resistance. Therefore, the first input of the NAND gate NAND1 provides a time constant. As described above, the gate width of the transistor comprising the first input of the NAND gate NAND1 is adjusted so that the time constant is longer than any of the breakdown times of the first to fourth ESD elements 10 to 40.

This structure meets the above described two conditions. That is, the second protection logic circuit NAND1 belonging to the second power supply system is coupled to the first protection logic circuit INV1 belonging to the first power supply system through the fifth surge current path Sur5. In addition, the input of the second protection logic circuit NAND1 belonging to the second power supply system, which is coupled to the fifth surge current path Sur5, has a time constant that is longer than any of the breakdown times of the ESD protection elements coupled between the high potential line and the low potential line, both of which belong to the first power supply system, and between the high potential line and the low potential line, both of which belong to the second power supply system. Therefore, the above described first protection logic circuit INV1 and the second protection logic circuit NAND1 protect the gates of the transistors of the interface logic circuits INV-B1 ... INV-Bn and the second protection logic circuit NAND1, both of which are included in the second interface 200 belonging to the second power supply system, from being destroyed until breakdown occurs in either of the above described first to fourth ESD protection transistors Tr10 to Tr40 since surge current has been applied.

In addition, the first protection logic circuit(s) INV1 and the second protection logic circuit(s) NAND1, both numbers of which are less than the plurality of the interface logic circuits INV-B1 . . . INV-Bn, must be provided for the purpose of protecting the plurality of the interface logic circuits INV-B1 . . . INV-Bn. This makes it possible to prevent an increase in the area occupied by a circuit.

Second Alternative Embodiment

Figure 4:
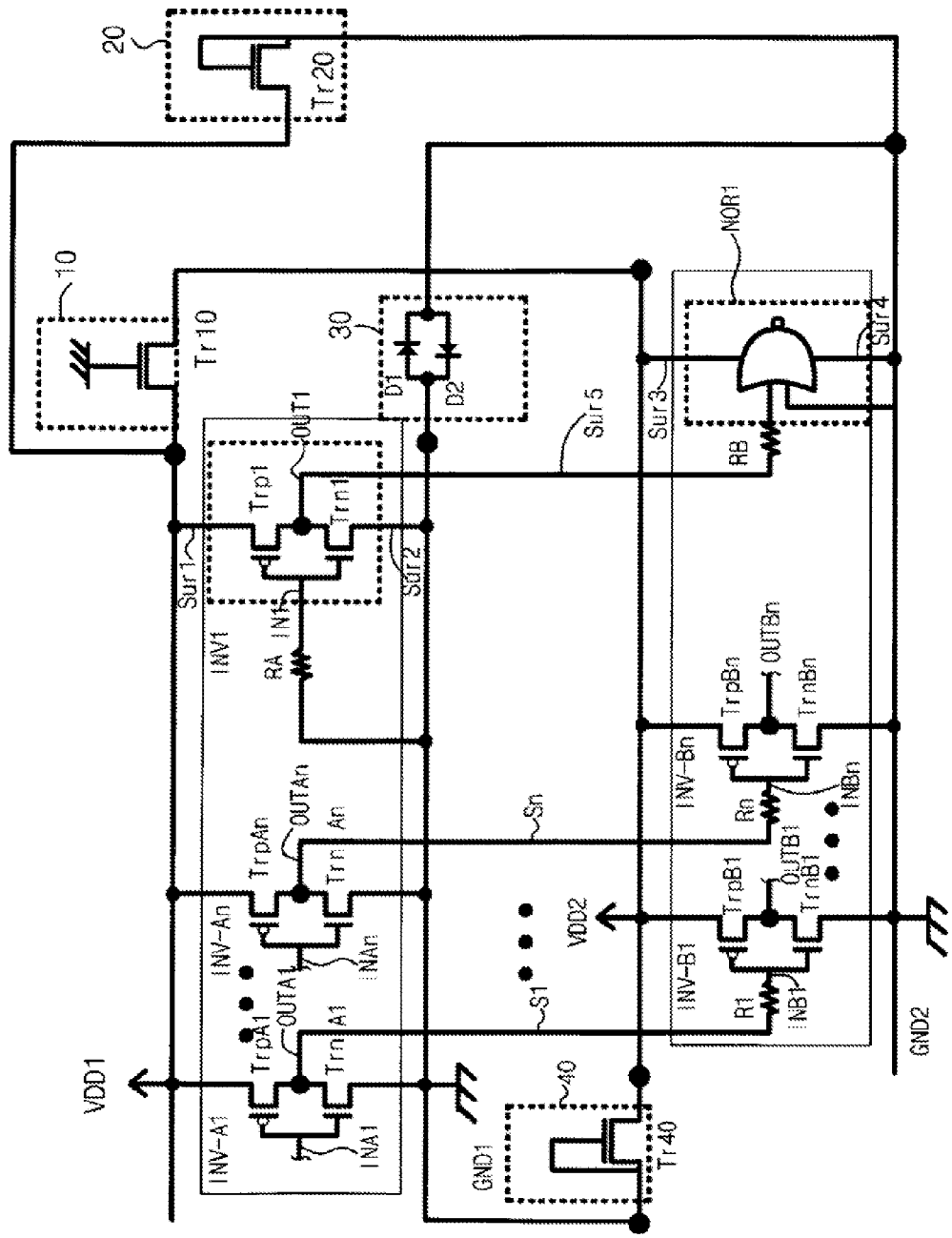
FIG. 4 is an equivalent circuit schematic of an ESD protection circuit included in an interface in accordance with a second alternative embodiment with respect to the first embodiment of the present invention.

FIG. 4 is an equivalent circuit diagram of an ESD protection circuit included in the interface in accordance with a second alternative embodiment with respect to the first embodiment of the present invention. One difference between the circuit in accordance with the second alternative embodiment shown in FIG. 4 and the circuit in accordance with the first embodiment shown in FIG. 2 is in that the second protection logic circuit belonging to the second power supply system is comprised of a dummy NOR gate NOR1 that does not have any output. One (i.e., a first input) of two inputs of the NOR gate NOR1 is coupled to the fifth surge current path Sur5 and the other (i.e., a second input) is floated or coupled to either of the second power supply line VDD2 and the second ground line GND2. In addition, the NOR gate NOR1 is formed not to have any output. The NOR gate NOR1 is coupled to the second power supply line VDD2 through the third surge current path Sur3. In addition, the NOR gate NOR1 is coupled to the second ground line GND2 through the fourth surge current path Sur4.

The NOR gate NOR1 is comprised of a plurality of transistors. The input of the NOR gate NOR1 is comprised of the gate of a transistor. Therefore, the first input of the NOR gate NOR1 provides a gate capacitance. In addition, the fifth surge current path Sur5 has a resistance. Therefore, the first input of the NOR gate NOR1 provides a time constant. As described above, the gate width of the transistor comprising the first input of the NOR gate NOR1 is adjusted so that the time constant is longer than any of the breakdown times of the first to fourth ESD elements 10 to 40.

This structure meets the above described two conditions. That is, the second protection logic circuit NOR1 belonging to the second power supply system is coupled to the first protection logic circuit INV1 belonging to the first power supply system through the fifth surge current path Sur5. In addition, the input of the second protection logic circuit NOR1 belonging to the second power supply system, which is coupled to the fifth surge current path Sur5, has a time constant that is longer than any of the breakdown times of the ESD protection elements coupled between the high potential line and the low potential line, both of which belong to the first power supply system, and between the high potential line and the low potential line, both of which belong to the second power supply system. Therefore, the above described first protection logic circuit INV1 and the second protection logic circuit NOR1 protect the gates of the transistors of the interface logic circuits INV-B1 . . . INV-Bn and the second protection logic circuit NOR1, both of which are included in the second interface 200 belonging to the second power supply system, from being destroyed until breakdown occurs in either of the above described first to fourth ESD protection transistors Tr10 to Tr40 since surge current has been applied. In addition, the first protection logic circuit(s) INV1 and the second protection logic circuit(s) NOR1, both numbers of which are less than the plurality of the interface logic circuits INV-B1 . . . INV-Bn, must be provided for the purpose of protecting the plurality of the interface logic circuits INV-B1 . . . INV-Bn. This makes it possible to prevent an increase in the area occupied by a circuit.

Third Alternative Embodiment

Figure 5:
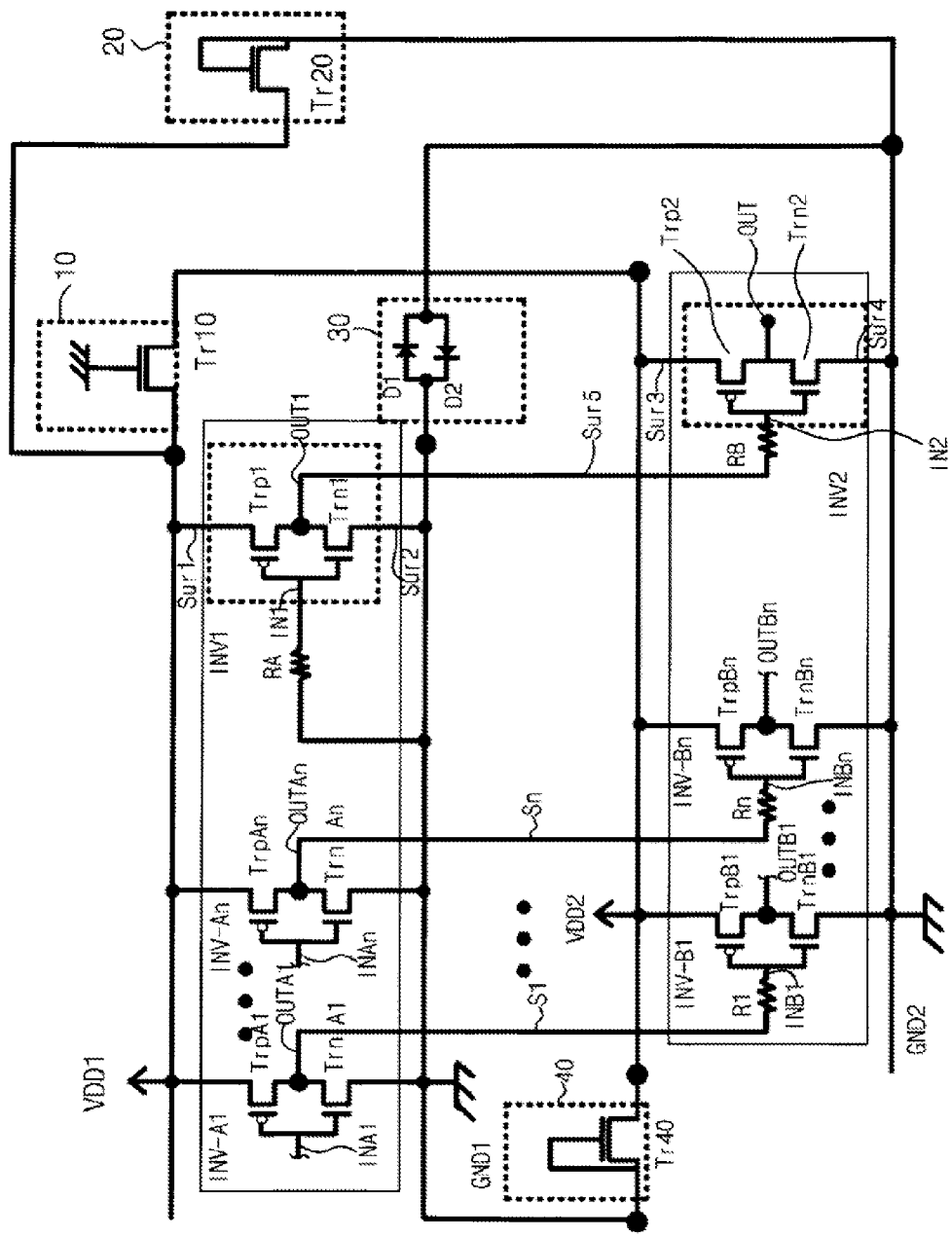
FIG. 5 is an equivalent circuit schematic of an ESD protection circuit included in an interface in accordance with a third alternative embodiment with respect to the first embodiment of the present invention.

FIG. 5 is an equivalent circuit diagram of an ESD protection circuit included in the interface in accordance with a third alternative embodiment with respect to the first embodiment of the present invention. One difference between the circuit in accordance with the third alternative embodiment shown in FIG. 5 and the circuit in accordance with the first embodiment shown in FIG. 2 is in that the second protection logic circuit INV2 belonging to the second power supply system has a floated output. That is, the second protective logic circuit INV2 is not a logic gate that performs signal processing and thus it is not required to have any output. This structure meets the above described two conditions. That is, the second protection logic circuit INV2 belonging to the second power supply system is coupled to the first protection logic circuit INV1 belonging to the first power supply system through the fifth surge current path Sur5. In addition, the input of the second protection logic circuit INV2 belonging to the second power supply system, which is coupled to the fifth surge current path Sur5, has a time constant that is longer than any of the breakdown times of the ESD protection elements coupled between the high potential line and the low potential line, both of which belong to the first power supply system, and between the high potential line and the low potential line, both of which belong to the second power supply system. Therefore, the above described first protection logic circuit INV1 and the second protection logic circuit INV2 protect the gates of the transistors of the interface logic circuits INV-B1 . . . INV-Bn and the second protection logic circuit INV2, both of which are included in the second interface 200 belonging to the second power supply system, from being destroyed until breakdown occurs in either of the above described first to fourth ESD protection transistors Tr10 to Tr40 since surge current has been applied. In addition, the first protection logic circuit(s) INV1 and the second protection logic circuit(s) INV2 must be provided, both numbers of which are less than the plurality of the interface logic circuits INV-B1 . . . INV-Bn, must be provided for the purpose of protecting the plurality of the interface logic circuits INV-B1 . . . INV-Bn. This makes it possible to prevent an increase in the area occupied by a circuit.

Fourth Alternative Embodiment

Figure 6:
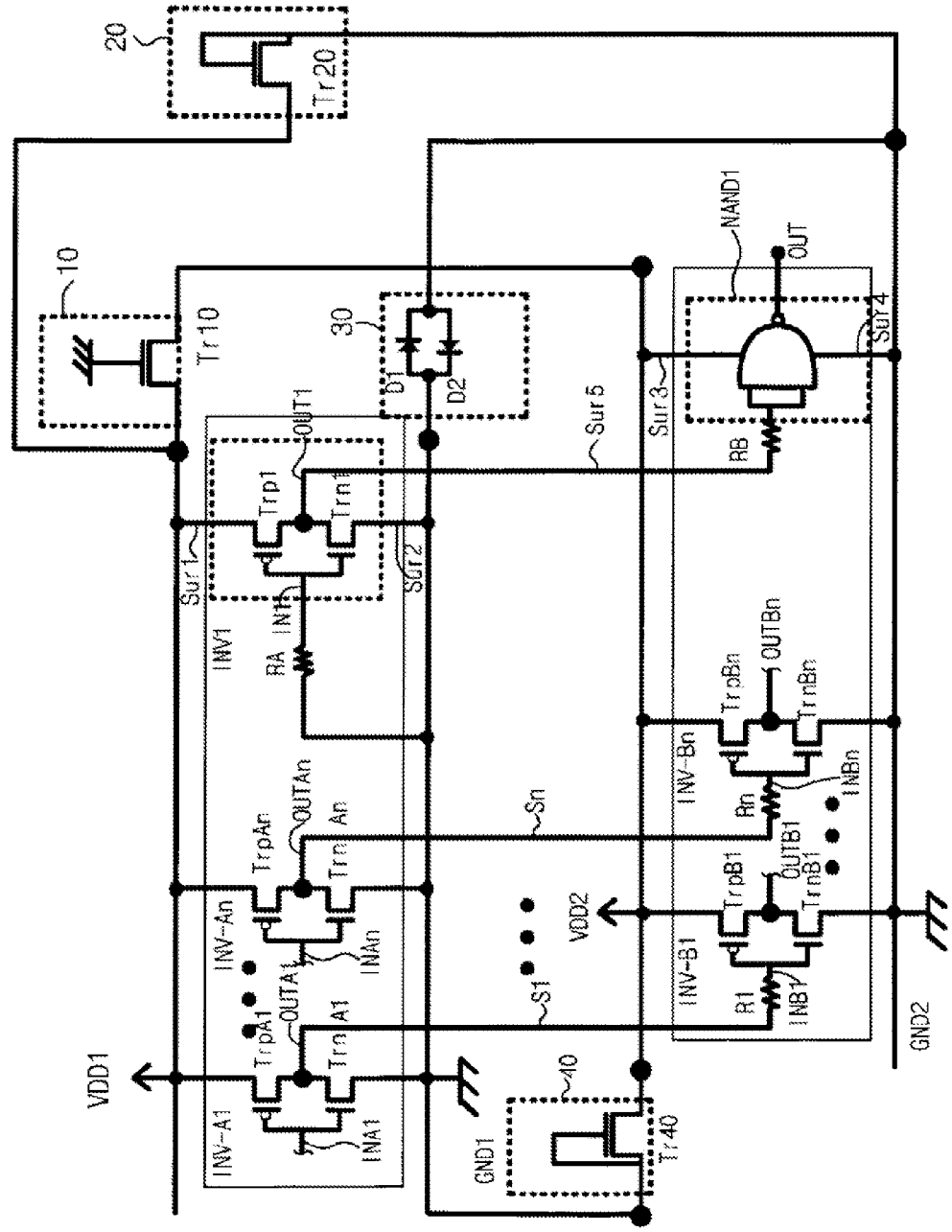
FIG. 6 is an equivalent circuit schematic of an ESD protection circuit included in an interface in accordance with a fourth alternative embodiment with respect to the first embodiment of the present invention.

FIG. 6 is an equivalent circuit diagram of an ESD protection circuit included in the interface in accordance with a fourth alternative embodiment with respect to the first embodiment of the present invention. One difference between the circuit in accordance with the fourth alternative embodiment shown in FIG. 6 and the circuit in accordance with the first embodiment shown in FIG. 2 is in that the second protection logic circuit belonging to the second power supply system is comprised of a dummy NAND gate NAND1 that has a floated output. One (i.e., a first input) of two inputs of the NAND gate NAND1 is coupled to the fifth surge current path Sur5, and the other (i.e., a second input) is floated or coupled to either of the second power supply line VDD2 and the second ground line GND2. In addition, the NAND gate NAND1 is formed to have a floated output. The NAND gate NAND1 is coupled to the second power supply line VDD2 through the third surge current path Sur3. In addition, the NAND gate NAND1 is coupled to the second ground line GND2 through the fourth surge current path Sur4.

The NAND gate NAND1 is comprised of a plurality of transistors. The input of the NAND gate NAND1 is comprised of the gate of a transistor. Therefore, the first input of the NAND gate NAND1 provides a gate capacitance. In addition, the fifth surge current path Sur5 has a resistance. Therefore, the first input of the NAND gate NAND1 provides a time constant. As described above, the gate width of the transistor comprising the first input of the NAND gate NAND1 is adjusted so that the time constant is longer than any of the breakdown times of the first to fourth ESD elements 10 to 40.

This structure meets the above described two conditions. That is, the second protection logic circuit NAND1 belonging to the second power supply system is coupled to the first protection logic circuit INV1 belonging to the first power supply system through the fifth surge current path Sur5. In addition, the input of the second protection logic circuit NAND1 belonging to the second power supply system, which is coupled to the fifth surge current path Sur5, has a time constant that is longer than any of the breakdown times of the ESD protection elements coupled between the high potential line and the low potential line, both of which belong to the first power supply system, and between the high potential line and the low potential line, both of which belong to the second power supply system. Therefore, the above described first protection logic circuit INV1 and the second protection logic circuit NAND1 protect the gates of the transistors of the interface logic circuits INV-B1 . . . INV-Bn and the second protection logic circuit NAND1, both of which are included in the second interface 200 belonging to the second power supply system, from being destroyed until breakdown occurs in either of the above described first to fourth ESD protection transistors Tr10 to Tr40 since surge current has been applied. In addition, the first protection logic circuit(s) INV1 and the second protection logic circuit(s) NAND1, both numbers of which are less than the plurality of the interface logic circuits INV-B1 . . . INV-Bn, must be provided for the purpose of protecting the plurality of the interface logic circuits INV-B1 . . . INV-Bn. This makes it possible to prevent an increase in the area occupied by a circuit.

Fifth Alternative Embodiment

Figure 7:
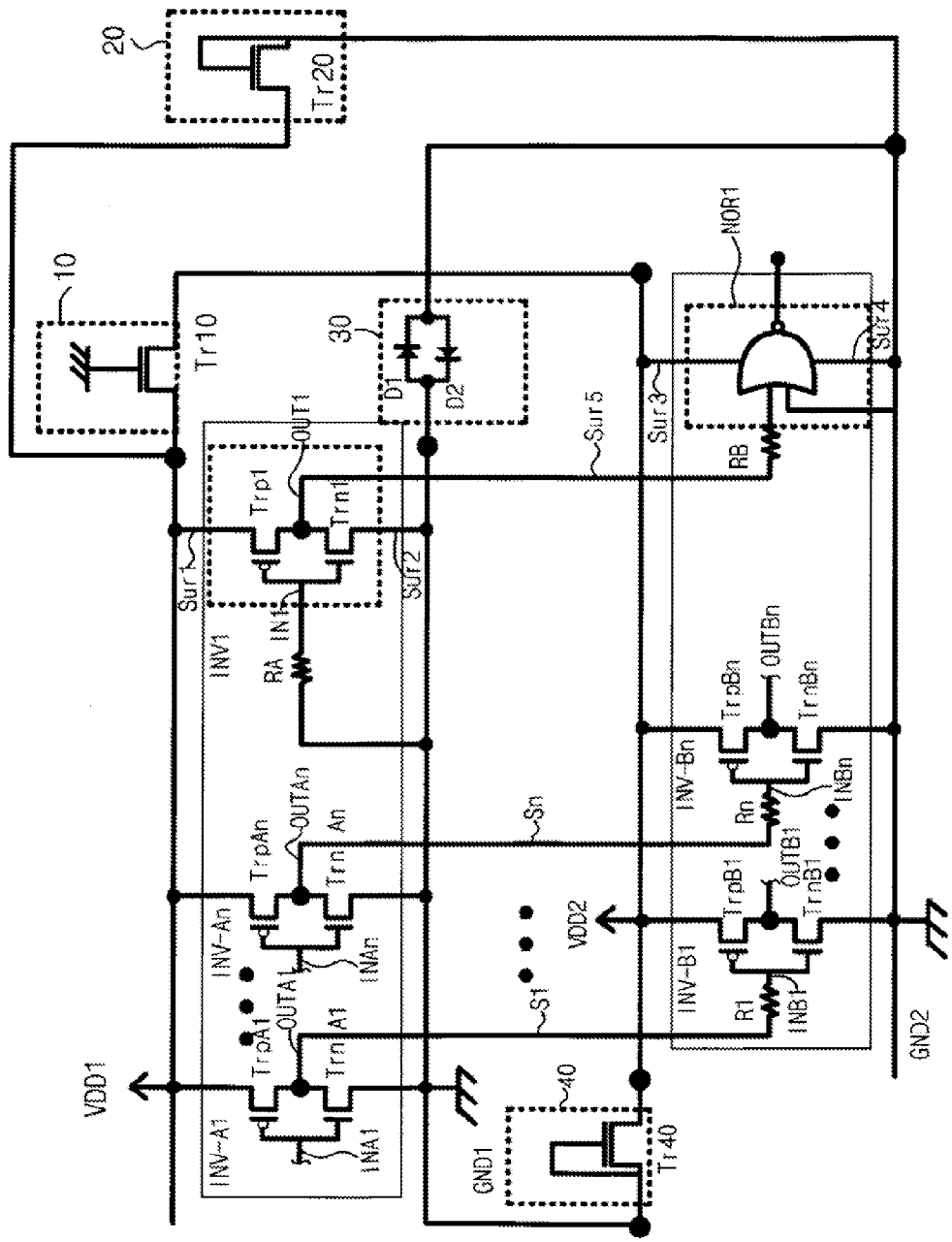
FIG. 7 is an equivalent circuit schematic of an ESD protection circuit included in an interface in accordance with a fifth alternative embodiment with respect to the first embodiment of the present invention.

FIG. 7 is an equivalent circuit diagram of an ESD protection circuit included in the interface in accordance with a fifth alternative embodiment with respect to the first embodiment of the present invention. One difference between the circuit in accordance with the fifth alternative embodiment shown in FIG. 7 and the circuit in accordance with the first embodiment shown in FIG. 2 is in that the second protection logic circuit belonging to the second power supply system is comprised of a dummy NOR gate NOR1 that has a floated output. One (i.e., a first input) of two inputs of the NOR gate NOR1 is coupled to the fifth surge current path Sur5 and the other (i.e., a second input) is floated or coupled to either of the second power supply line VDD2 and the second ground line GND2. In addition, the NOR gate NOR1 is formed to have a floated output. The NOR gate NOR1 is coupled to the second power supply line VDD2 through the third surge current path Sur3. In addition, the NOR gate NOR1 is coupled to the second ground line GND2 through the fourth surge current path Sur4.

The NOR gate NOR1 is comprised of a plurality of transistors. The input of the NOR gate NOR1 is comprised of the gate of a transistor. Therefore, the first input of the NOR gate NOR1 provides a gate capacitance. In addition, the fifth surge current path Sur5 has a resistance. Therefore, the first input of the NOR gate NOR1 provides a time constant. As described above, the gate width of the transistor comprising the first input of the NOR gate NOR1 is adjusted so that the time constant is longer than any of the breakdown times of the first to fourth ESD elements 10 to 40.

This structure meets the above described two conditions. That is, the second protection logic circuit NOR1 belonging to the second power supply system is coupled to the first protection logic circuit INV1 belonging to the first power supply system through the fifth surge current path Sur5. In addition, the input of the second protection logic circuit NOR1 belonging to the second power supply system, which is coupled to the fifth surge current path Sur5, has a time constant that is longer than any of the breakdown times of the ESD protection elements coupled between the high potential line and the low potential line, both of which belong to the first power supply system, and between the high potential line and the low potential line, both of which belong to the second power supply system. Therefore, the above described first protection logic circuit INV1 and the second protection logic circuit NOR1 protect the gates of the transistors of the interface logic circuits INV-B1 . . . INV-Bn and the second protection logic circuit NOR1, both of which are included in the second interface 200 belonging to the second power supply system, from being destroyed until breakdown occurs in either of the above described first to fourth ESD protection transistors Tr10 to Tr40 since surge current has been applied. In addition, the first protection logic circuit(s) INV1 and the second protection logic circuit(s) NOR1, both numbers of which are less than the plurality of the interface logic circuits INV-B1 . . . INV-Bn, must be provided for the purpose of protecting the plurality of the interface logic circuits INV-B1 . . . INV-Bn. This makes it possible to prevent an increase in the area occupied by a circuit.

Sixth Alternative Embodiment

Figure 8:
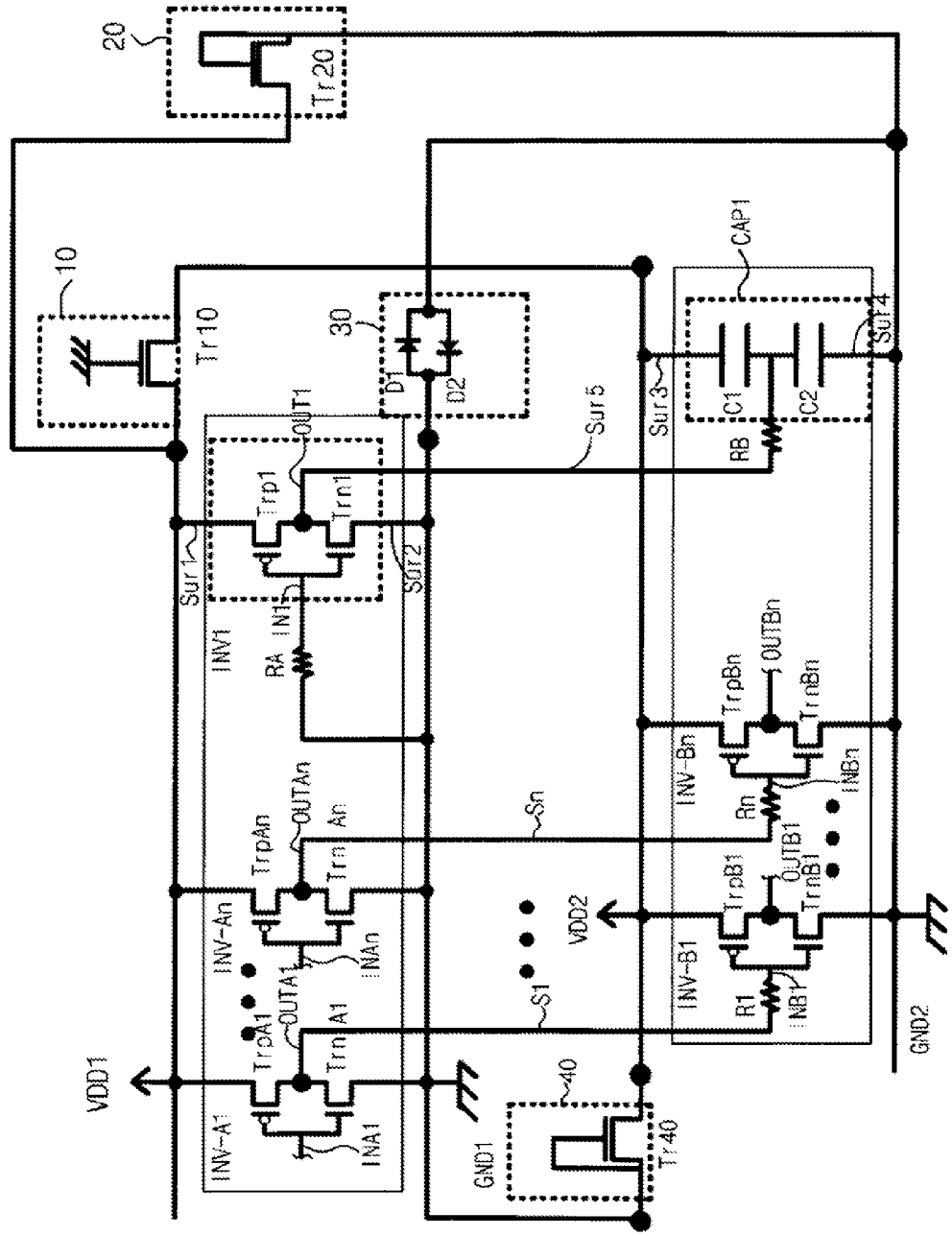
FIG. 8 is an equivalent circuit schematic of an ESD protection circuit included in an interface in accordance with a sixth alternative embodiment with respect to the first embodiment of the present invention.

FIG. 8 is an equivalent circuit diagram of an ESD protection circuit included in the interface in accordance with a sixth alternative embodiment with respect to the first embodiment of the present invention. One difference between the circuit in accordance with the sixth alternative embodiment shown in FIG. 8 and the circuit in accordance with the first embodiment shown in FIG. 2 is in that a second protection circuit CAP1 is provided instead of the second protection logic circuit belonging to the second power supply system. The second protection circuit CAP1 is comprised of a pair of capacitors that is serially coupled between the second power supply line VDD2 and the second ground line GND2. The pair of capacitors is comprised of a first capacitor C1 that is coupled to the second power supply line VDD2 through the third surge current path Sur3 and a second capacitor C2 that is coupled to the second ground line GND2 through the fourth surge current path Sur4. The fifth surge current path Sur5 is coupled between the first capacitor C1 and the second capacitor C2. In other words, the first capacitor C1 provides a first capacitance. The second capacitor C2 provides a second capacitance. Therefore, the pair of capacitors provides a sum C of the first capacitance and the second capacitance. Furthermore, the fifth surge current path Sur5 has a resistance. Therefore, the input of the second protection circuit CAP1 provides a time constant. As described above, the first capacitance and the second capacitance are adjusted so that the time constant is longer than any of the breakdown times of the first to fourth ESD protection elements 10 to 40.

This structure meets the above described two conditions. That is, the second protection circuit CAP1 belonging to the second power supply system is coupled to the first protection logic circuit INV1 belonging to the first power supply system through the fifth surge current path Sur5. In addition, the input of the second protection circuit CAP1 belonging to the second power supply system has a time constant that is longer than any of the breakdown times of the ESD protection elements coupled between the high potential line and the low potential line, both of which belong to the first power supply system, and between the high potential line and the low potential line, both of which belong to the second power supply system. Therefore, the above described first protection logic circuit INV1 and the second protection circuit CAP1 protect the gates of the transistors of the interface logic circuits INV-B1 . . . INV-Bn that are included in the second interface 200 belonging to the second power supply system from being destroyed until breakdown occurs in either of the above described first to fourth ESD protection transistors Tr10 to Tr40 since surge current has been applied. In addition, the first protection logic circuit(s) INV1 and the second protection circuit(s) CAP1, both numbers of which are less than the plurality of the interface logic circuits INV-B1 . . . INV-Bn, must be provided for the purpose of protecting the plurality of the interface logic circuits INV-B1 . . . INV-Bn. This makes it possible to prevent an increase in the area occupied by a circuit.

A circuit configuration protecting interfaces belonging to two different power supply systems from surge current is described in the above described embodiment and the alternative embodiments. However, the present invention can also be applied to a circuit that protects interfaces belonging to three or more different power supply systems from surge current.

The term "configured" as used herein to describe a component, section or part of a device includes hardware and/or software that is constructed and/or programmed to carry out the desired function.

Moreover, terms that are expressed as "means-plus-function" in the claims should include any structure that can be utilized to carry out the function of that part of the present invention.

The terms of degree such as "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2005-219034. The entire disclosure of Japanese Patent Application No. 2005-219034 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A semiconductor device, comprising at least:
   a plurality of first interface circuits that are electrically coupled between a first power supply line belonging to a first power supply system and a second power supply line belonging to the first power supply system, respectively;
   one or more first circuits comprise a first surge current path coupled to the first power supply line and a second surge current path coupled to the second power supply line, the number of the one or more first circuits being less than the plurality of first interface circuits;
   a plurality of second interface circuits that are electrically coupled between a third power supply line belonging to a second power supply system that is independent from the first power supply system, and a fourth power supply line belonging to the second power supply system, respectively, and further electrically coupled to a corresponding interface circuit of the plurality of first interface circuits, respectively; and
   one or more second circuits that comprise a third surge current path coupled to the one or more first circuits and have a first time constant derived by a first resistance coupled to the third surge current path and a first capacitance, the number of the one or more second circuits being less than the plurality of the second interface circuits.

2. The semiconductor device according to claim 1, wherein the plurality of first interface circuits, the plurality of second interface circuits, the one or more first circuits, and the one or more second circuits comprise a first logic circuit configuration.

3. The semiconductor device according to claim 2, wherein the first logic circuit configuration comprises complementary metal oxide semiconductor (CMOS) inverters.

4. The semiconductor device according to claim 3, wherein a gate width of a transistor comprising the CMOS inverter included in the second circuit is wider than a gate width of a transistor comprising the CMOS inverter included in each of the plurality of the second interface circuits.

5. The semiconductor device according to claim 3,
   wherein the sum of a gate width of an n-channel transistor included in the second circuit and a gate width of the plurality of n-channel transistors included in the plurality of second interface circuits is 450 µm or more; and
   the sum of a gate width of a p-channel transistor included in the second circuit and a gate width of the plurality of p-channel transistors included in the plurality of second interface circuits is 450 µm or more.

6. The semiconductor device according to claim 4,
   wherein the sum of a gate width of an n-channel transistor included in the second circuit and a gate width of the plurality of n-channel transistors included in the plurality of second interface circuits is 450 µm or more; and
   the sum of a gate width of a p-channel transistor included in the second circuit and a gate width of the plurality of p-channel transistors included in the plurality of second interface circuits is 450 µm or more.

7. The semiconductor device according to claim 4, wherein the gate width of the transistor included in the second circuit is set so that the sum of the gate width of the transistor included in the second circuit and the sum of the gate widths of the plurality of transistors included in the plurality of second interface circuits is a predetermined value.

8. The semiconductor device according to claim 5, wherein the gate width of the transistor included in the second circuit is set so that the sum of the gate width of the transistor included in the second circuit and the sum of the gate widths of the plurality of transistors included in the plurality of second interface circuits is a predetermined value.

9. The semiconductor device according to claim 3, wherein the gate width of a transistor comprising the CMOS inverter included in the first circuit and the gate width of a transistor comprising the CMOS transistor included in each of the plurality of first interface circuits are the same.

10. The semiconductor device according to one of claim 1, wherein the first resistance is smaller than any of a plurality of resistances provided between the plurality of first interface circuits and the plurality of second interface circuits, respectively.

11. The semiconductor device according to one of claim 1, wherein the first capacitance is a gate capacitance of a transistor.

12. The semiconductor device according to claim 1, wherein the second circuit further comprises a fourth surge current path coupled to the third power supply line and a fifth surge current path coupled to the fourth power supply line.

13. The semiconductor device according to claim 1, further comprising:
a first protection circuit that is coupled between the first power supply line and the third power supply line and has a first breakdown time;
a second protection circuit that is coupled between the first power supply line and the fourth power supply line and has a second breakdown time;
a third protection circuit that is coupled between the second power supply line and the fourth power supply line and has a third breakdown time; and
a fourth protection circuit that is coupled between the second power supply line and the third power supply line and has a fourth breakdown time; and
wherein the first time constant is longer than any of the first to fourth breakdown times.

14. The semiconductor device according to claim 1, wherein the second circuit does not comprise an output.

15. The semiconductor device according to claim 1, wherein the second circuit comprises an input coupled to the third surge current path and a floated output.

16. The semiconductor device according to claim 1, wherein there is only one first circuit and one second circuit present in the semiconductor device.

17. The semiconductor device according to claim 1, wherein the first capacitance is the capacitance of a capacitor element.

18. A semiconductor device, comprising:
a plurality of first interface circuits that are electrically coupled between a first power supply line and a second power supply line which both belong to a first power supply system; and
a first dummy logic circuit that comprises a first surge current path coupled to the first power supply line, a second surge current path coupled to the second power supply line, and an input electrically coupled to a third surge current path, but does not comprise an output.

19. The semiconductor device according to claim 18, wherein the first dummy logic circuit comprises at least one transistor, and a gate width of the transistor is wider than a gate width of the transistor included in each of the plurality of first interface circuits.

20. A semiconductor device, comprising:
a plurality of first interface circuits that are electrically coupled between a first power supply line and a second power supply line which both belong to a first power supply system, respectively; and
a first dummy logic circuit that comprises a first surge current path coupled to the first power supply line, a second surge current path connected to the second power supply line, an input electrically coupled to a third surge current path, and a floated output.

21. The semiconductor device according to claim 20, wherein the first logic circuit comprises at least one transistor, and a gate width of the transistor gate is wider than a gate width of the transistor included in each of the plurality of first interface circuits.

22. A semiconductor device, comprising:
a plurality of first interface circuits that are electrically coupled between a first power supply line belonging to a first power supply system and a second power supply line belonging to the first power supply system, respectively;
one or more first circuits that comprise a first surge current path coupled to the first power supply line and a second surge current path coupled to the second power supply line, the number of the one or more first circuits being less than the plurality of first interface circuits;
a plurality of second interface circuits that are electrically coupled between a third power supply line belonging to a second power supply system that is independent from the first power supply system, and a fourth power supply line belonging to the second power supply system, respectively, and electrically coupled to a corresponding interface circuit of the plurality of first interface circuits; and
one or more second circuits that comprise a third surge current path coupled to the third power supply line, a fourth surge current path coupled to the fourth power supply line, a fifth surge current path coupled to the first circuit, and an input coupled to the fifth surge current path, but does not comprise an output, the number of second circuits being less than the plurality of second interface circuits.

23. The semiconductor device according to claim 22, wherein the one or more second circuits comprise at least one transistor, and a gate width of the transistor is wider than a gate width of the transistor included in each of the plurality of second interface circuits.

24. The semiconductor device according to one of claim 22, wherein the one or more second circuits further have a first time constant derived by a first resistance coupled to the fifth surge current path and a first capacitance.

25. The semiconductor device according to one of claim 23, wherein the one or more second circuits further have a first time constant derived by a first resistance coupled to the fifth surge current path and a first capacitance.

26. The semiconductor device according to claim 24, further comprising:
a first protection circuit that is coupled between the first power supply line and the third power supply line and has a first breakdown time;
a second protection circuit that is coupled between the first power supply line and the fourth power supply line and has a second breakdown time;
a third protection circuit that is coupled between the second power supply line and the fourth power supply line and has a third breakdown time; and
a fourth protection circuit that is coupled between the second power supply line and the third power supply line and has a fourth breakdown time; and
wherein the first time constant is longer than any of the first to fourth breakdown times.

27. A semiconductor device, comprising:
a plurality of first interface circuits that are electrically coupled between a first power supply line belonging to a first power supply system, and a second power supply line belonging to the first power supply system, respectively;

one or more first circuits that comprise a first surge current path coupled to the first power supply line, and a second surge current path coupled to the second power supply line, the number of the one or more first circuits being less than the plurality of first interface circuits;

a plurality of second interface circuits that are electrically coupled between a third power supply line belonging to a second power supply system that is independent from the first power supply system, and a fourth power supply line belonging to the second power supply system, respectively, and electrically coupled to a corresponding interface circuit of the plurality of first interface circuits; and one or more second circuits that comprise a third surge current path coupled to the third power supply line, a fourth surge current path coupled to the fourth power supply line, a fifth surge current path coupled to the first circuit, an input coupled to the fifth surge current path, and a floated output, the number of the one or more second circuits being less than the plurality of second interface circuits.

28. The semiconductor device according to claim 27, wherein the one or more second circuits comprise at least one transistor, and a gate width of the transistor is wider than a gate width of the transistor included in each of the plurality of second interface circuits.

29. The semiconductor device according to one of claim 27, wherein the one or more second circuits further have a first time constant derived by a first resistance coupled to the fifth surge current path and a first capacitance.

30. The semiconductor device according to one of claim 28, wherein the one or more second circuits further have a first time constant derived by a first resistance coupled to the fifth surge current path and a first capacitance.

31. The semiconductor device according to claim 29, further comprising:

a first protection circuit that is coupled between the first power supply line and the third power supply line and has a first breakdown time;

a second protection circuit that is coupled between the first power supply line and the fourth power supply line and has a second breakdown time;

a third protection circuit that is coupled between the second power supply line and the fourth power supply line and has a third breakdown time; and a fourth protection circuit that is coupled between the second power supply line and the third power supply line and has a fourth breakdown time; and wherein the first time constant is longer than any of the first to fourth breakdown times.

32. A semiconductor device, comprising:

a plurality of first interface circuits that are electrically coupled between a first power supply line belonging to a first power supply system, and a second power supply line belonging to the first power supply system, respectively;

one or more first circuits that comprise a first surge current path coupled to the first power supply line, and a second surge current path coupled to the second power supply line, the number of the one or more first circuits being less than the plurality of first interface circuits;

a plurality of second interface circuits that are electrically coupled between a third power supply line belonging to a second power supply system that is independent from the first power supply system, and a fourth power supply line belonging to the second power supply system, respectively, and electrically coupled to the plurality of first interface circuits;

a first protection circuit that is coupled between the first power supply line and the third power supply line and has a first breakdown time;

a second protection circuit that is coupled between the first power supply line and the fourth power supply line and has a second breakdown time;

a third protection circuit that is coupled between the second power supply line and the fourth power supply line and has a third breakdown time;

a fourth protection circuit that is coupled between the second power supply line and the third power supply line and has a fourth breakdown time; and one or more second circuits that have a third surge current path coupled to the third power supply line, a fourth surge current path coupled to the fourth power supply line, a fifth surge current path coupled to the first circuit, and a first time constant that is derived by a first resistance coupled to the fifth surge current path and a first capacitance and is larger than any of the first to fourth breakdown times, the number of the one or more second circuits being less than the plurality of second interface circuits.

33. The semiconductor device according to claim 32, wherein a gate width of the transistor included in the one or more second circuits is wider than a gate width of the transistor included in each of the plurality of second interface circuits.

34. The semiconductor device according to claim 33, wherein the one or more second circuits comprise an input coupled to the fifth surge current path and does not comprise an output.

* * * * *